(12) United States Patent
Su et al.

(10) Patent No.: US 12,001,622 B2
(45) Date of Patent: Jun. 4, 2024

(54) ARRAY SUBSTRATE AND MANUFACTURING METHOD THEREOF, AND TOUCH DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Qiujie Su, Beijing (CN); Chongyang Zhao, Beijing (CN); Yanping Liao, Beijing (CN); Zhihua Sun, Beijing (CN); Seungmin Lee, Beijing (CN)

(73) Assignees: BEIJING BOE DISPLAY TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 148 days.

(21) Appl. No.: 17/423,222

(22) PCT Filed: Feb. 2, 2021

(86) PCT No.: PCT/CN2021/074896
§ 371 (c)(1),
(2) Date: Jul. 15, 2021

(87) PCT Pub. No.: WO2021/196871
PCT Pub. Date: Oct. 7, 2021

(65) Prior Publication Data
US 2022/0342500 A1     Oct. 27, 2022

(30) Foreign Application Priority Data
Mar. 31, 2020   (CN) .......................... 202010242031.3

(51) Int. Cl.
G06F 3/041     (2006.01)
G06F 3/044     (2006.01)

(52) U.S. Cl.
CPC ............ G06F 3/0412 (2013.01); G06F 3/044 (2013.01); G06F 2203/04103 (2013.01)

(58) Field of Classification Search
None
See application file for complete search history.

(56) References Cited

U.S. PATENT DOCUMENTS 9,465,268 B2   10/2016   Park et al.
10,261,624 B2   4/2019   Ding et al.
(Continued)

FOREIGN PATENT DOCUMENTS

CN   1020110071681 A   6/2011
CN       103869562 A   6/2014
(Continued)

*Primary Examiner* — Christopher R Lamb
(74) *Attorney, Agent, or Firm* — Dilworth & Barrese, LLP.; Michael J. Musella, Esq.

(57) ABSTRACT

An array substrate, a manufacturing method of the array substrate, and a touch display device are provided. Orthographic projections of the touch signal lines adjacent to each other included in a same touch signal line group on the base substrate are respectively provided on two sides of an orthographic projection of a same second signal line on the base substrate, each of the orthographic projections of the touch signal lines adjacent to each other and the orthographic projection of the same second signal line includes a portion provided between orthographic projections of the touch electrodes adjacent to each other on the base substrate, and a layer in which the touch signal lines adjacent to each other are provided is different from a layer in which the same second signal line is provided.

18 Claims, 13 Drawing Sheets

(56) References Cited

U.S. PATENT DOCUMENTS

| | | | | |
|---|---|---|---|---|
| 2016/0041665 A1* | 2/2016 | Gwon | ................ | G06F 3/0412 |
| | | | | 345/174 |
| 2019/0079620 A1* | 3/2019 | Yoshida | ............... | G02F 1/1368 |
| 2019/0310728 A1* | 10/2019 | Yoshida | ............... | G06F 3/0443 |
| 2020/0004368 A1* | 1/2020 | Kim | ..................... | G06F 3/0446 |
| 2020/0278571 A1* | 9/2020 | Kajita | ................. | G06F 3/0412 |
| 2021/0034183 A1* | 2/2021 | Chiu | .................. | G06F 3/04166 |

FOREIGN PATENT DOCUMENTS

| | | | |
|---|---|---|---|
| CN | 104142593 | A | 11/2014 |
| CN | 104991690 | A | 10/2015 |
| CN | 110376809 | A | 10/2019 |

\* cited by examiner

ARRAY SUBSTRATE AND MANUFACTURING METHOD THEREOF, AND TOUCH DISPLAY DEVICE

The present application claims priority of the Chinese Patent Application No. 202010242031.3 filed on Mar. 31, 2020. For all purposes, the entire disclosure of the aforementioned application is incorporated by reference as part of the disclosure of this application.

TECHNICAL FIELDS

The embodiments of the disclosure relates to an array substrate, a manufacturing method of the array substrate, and a touch display device.

BACKGROUND

Touch screen is very popular in recent years. The touch screen saves space, is convenient to carry, and has better human-computer interaction. Among all kinds of touch screens, capacitive touch screen is widely used because of its strong sensitivity and multi-touch capability and the like.

The working principle of the capacitive touch screen is as follows: a conductive element is provided on a surface of a substrate as a touch electrode; in a case that a touch object (such as a user's finger) touches the touch screen, the capacitance of the touch electrode at the touch point changes, and the position of the touch point on the touch screen can be detected according to the change of the capacitance.

The capacitive touch screen is classified into mutual-capacitance touch screen and self-capacitance touch screen. Compared with the mutual-capacitance touch screen, the self-capacitance touch screen has higher accuracy and higher signal-to-noise ratio.

In-cell touch screen is a touch screen in which the touch electrode is provided between an array substrate and an opposite substrate of a display panel. The in-cell touch screen has higher integration and smaller weight, and thus has a wider application prospects.

SUMMARY

At least one embodiment of the present disclosure provides an array substrate. The array substrate comprises a base substrate; a plurality of first signal lines provided on the base substrate; a plurality of second signal lines provided on the base substrate, wherein orthographic projections of the plurality of second signal lines on the base substrate intersect with orthographic projections of the plurality of first signal lines on the base substrate; a plurality of touch sensing blocks provided on the base substrate and spaced apart from each other, wherein each of the plurality of touch sensing blocks comprises a plurality of touch electrodes electrically connected with each other and spaced apart from each other; and a plurality of touch signal lines provided on the base substrate, wherein at least some of the plurality of touch signal lines are electrically connected with the plurality of touch sensing blocks respectively. The plurality of touch signal lines extend along an extension direction of the plurality of second signal lines, the plurality of touch signal lines are grouped into a plurality of touch signal line groups, each touch signal line group comprises the touch signal lines adjacent to each other, orthographic projections of the touch signal lines adjacent to each other comprised in a same touch signal line group on the base substrate are respectively provided on two sides of an orthographic projection of a same second signal line on the base substrate, each of the orthographic projections of the touch signal lines adjacent to each other and the orthographic projection of the same second signal line comprises a portion provided between orthographic projections of the touch electrodes adjacent to each other on the base substrate, and a layer in which the touch signal lines adjacent to each other are provided is different from a layer in which the same second signal line is provided.

For example, each of the plurality of touch signal lines comprises a plurality of main portions and a plurality of bent portions, and the plurality of main portions and the plurality of bent portions are alternately provided; an orthographic projection of each of the plurality of main portions on the base substrate is provided in a region between the orthographic projections of the touch electrodes adjacent to each other on the base substrate.

For example, the array substrate further comprises a plurality of switching elements provided on the base substrate, wherein each of the plurality of switching elements is provided between one of the plurality of bent portions and the same second signal line.

For example, the plurality of first signal lines are provided with a plurality of openings; and orthographic projections of at least some of the plurality of openings on the base substrate overlap with orthographic projections of the plurality of bent portions on the base substrate respectively.

For example, each of the plurality of touch sensing blocks comprises a plurality of touch electrode groups arranged sequentially, and each of the plurality of touch electrode groups comprises multiple touch electrodes spaced apart from each other and a first extension portion electrically connected with the multiple touch electrodes; and each of the plurality of touch sensing blocks further comprises a plurality of second extension portions, and each of the plurality of second extension portions is provided between and electrically connected with the touch electrode groups adjacent to each other.

For example, one of the plurality of first signal lines and a third extension portion are provided between the touch sensing blocks adjacent to each other in the extension direction of the plurality of second signal lines, the third extension is electrically connected with one of the touch sensing blocks adjacent to each other and insulated from the other of the touch sensing blocks adjacent to each other, and an orthographic projection of the third extension on the base substrate intersects with an orthographic projection of the one of the plurality of first signal line provided between the touch sensing blocks adjacent to each other on the base substrate.

For example, the plurality of second extension portions and the third extension portion are provided in a same layer, and the plurality of second extension portions and the third extension portion extend along the extension direction of the plurality of second signal lines.

For example, the plurality of first signal lines are provided with a plurality of openings, and orthographic projections of the plurality of second extension portion and the third extension portion on the base substrate respectively overlap with orthographic projections of at least some of the plurality of openings on the base substrate.

For example, the array substrate comprises a common electrode layer and a pixel electrode layer, the common electrode layer is provided between the base substrate and the pixel electrode layer in a direction perpendicular to the base substrate, and the common electrode layer comprises the plurality of touch electrodes in the plurality of touch sensing blocks; the pixel electrode layer comprises a first portion, a second portion and a third portion, wherein one of the plurality of second extension portions is electrically connected with the touch electrode groups adjacent to each other by the first portion and the second portion, and the third extension portion is electrically connected with the one of the touch sensing blocks adjacent to each other by the third portion.

For example, the pixel electrode layer further comprises a fourth portion, and the first extension portion is electrically connected with one of the plurality of touch signal lines by the fourth portion so as to electrically connect the touch sensing block including the first extension portion to the one of the plurality of touch signal lines.

For example, the plurality of second extension portions, the third extension and the plurality of second signal lines are provided in a same layer.

For example, the array substrate comprises the common electrode layer, a first conductive layer, a second conductive layer, a third conductive layer and the pixel electrode layer which are provided on the base substrate; the common electrode layer comprises a plurality of rows of touch electrodes, the plurality of rows of touch electrodes extend along a first direction and are sequentially arranged along a second direction, and the second direction is different from the first direction; the first conductive layer comprises the plurality of first signal lines extending along the first direction and a plurality of rows of first extension portions extending along the first direction, each row of first extension portions comprises a plurality of first extension portions disconnected from each other, and each first extension portion is electrically connected with some touch electrodes of a same row of touch electrodes to constitute the touch electrode group, the plurality of first signal lines and the plurality of rows of first extension portions are alternately provided and insulated from each other; the second conductive layer comprises the plurality of second signal lines extending along the second direction and a plurality of columns of extension portions extending along the second direction, at least some of the plurality of columns of extension portions comprise a plurality of second extension portions disconnected from each other and a plurality of third extension portions disconnected from each other, one row of the plurality of rows of touch electrodes is provided between the second extension portions adjacent to each other in the second direction, each second extension portion is electrically connected with the touch electrode groups adjacent to each other in the second direction, multiple rows of the plurality of rows of touch electrodes are provided between the third extension portions adjacent to each other in the second direction, and each third extension portion is electrically connected with one touch electrode group, so that the plurality of rows of touch electrodes, the plurality of rows of first extension portions and the plurality of columns of extension portions are combined into the plurality of touch sensing blocks, and each touch sensing block comprises the plurality of touch electrode groups which are electrically connected with each other and sequentially arranged in the second direction; the third conductive layer comprises the plurality of touch signal lines; the pixel electrode layer comprises a plurality of pixel electrodes, and an orthographic projection of one of the plurality of touch signal lines on the base substrate comprises a portion provided between orthographic projections of the second signal line and the pixel electrode which are adjacent to the one of the plurality of touch signal lines on the base substrate.

For example, the array substrate comprises a common electrode layer and a pixel electrode layer, the pixel electrode layer is provided between the base substrate and the common electrode layer in a direction perpendicular to the base substrate; the common electrode layer comprises the plurality of touch electrodes in the plurality of touch sensing blocks, the plurality of second extension portions and the third extension portion.

For example, the array substrate comprises the pixel electrode layer, a first conductive layer, a second conductive layer, a third conductive layer and the common electrode layer which are provided on the base substrate; the pixel electrode layer comprises a plurality of pixel electrodes; the first conductive layer comprises the plurality of first signal lines and a plurality of rows of first extension portions, the plurality of first signal lines and the plurality of rows of first extension portions extend along a first direction and are sequentially arranged along a second direction different from the first direction, each row of first extension portions comprises a plurality of first extension portions which are disconnected from each other, and the plurality of first signal lines and the plurality of rows of first extension portions are alternately provided and insulated from each other; the second conductive layer comprises the plurality of second signal lines extending along the second direction; the third conductive layer comprises the plurality of touch signal lines, and one of the plurality of touch signal lines is electrically connected with the first extension portions of the plurality of touch electrode groups comprised in the same touch sensing block; the common electrode layer comprises the touch electrodes, the second extension portions and the third extension portion, and the touch electrodes, the second extension portions and the third extension portion comprised in the common electrode layer and the plurality of rows of first extension portions comprised in the first conductive layer are combined into the plurality of touch sensing blocks.

For example, the array substrate comprises a common electrode layer and a pixel electrode layer sequentially provided on the base substrate, and the common electrode layer comprises the plurality of touch electrodes.

For example, the array substrate comprises a plurality of sub-pixel regions, each of the plurality of sub-pixel regions is provided with one touch electrode of the plurality of touch sensing blocks, and each touch electrode is provided in one of the plurality of sub-pixel regions.

For example, a total number of the plurality of touch signal lines is greater than a total number of the plurality of touch sensing blocks; the plurality of touch signal lines comprise a plurality of first touch signal lines and a plurality of second touch signal lines, the plurality of first touch signal lines are electrically connected with the plurality of touch sensing blocks respectively, and the plurality of second touch signal lines are insulated from the plurality of touch sensing blocks.

At least one embodiment of the present disclosure provides a touch display device, which comprises the array substrate described in any one of the above embodiments.

At least one embodiment of the present disclosure provides a manufacturing method of the array substrate. The method comprises: forming a plurality of first signal lines on a base substrate; forming a plurality of second signal lines on the base substrate, wherein orthographic projections of the plurality of second signal lines on the base substrate intersect with orthographic projections of the plurality of first signal lines on the base substrate; forming a plurality of touch sensing blocks spaced apart from each other on the base substrate, wherein each of the plurality of touch sensing blocks comprises a plurality of touch electrodes electrically connected with each other and spaced apart from each other; and forming a plurality of touch signal lines on the base substrate, wherein at least some of the plurality of touch signal lines are electrically connected with the plurality of touch sensing blocks respectively. The plurality of touch signal lines extend along an extension direction of the plurality of second signal lines, the plurality of touch signal lines are grouped into a plurality of touch signal line groups, each touch signal line group comprises the touch signal lines adjacent to each other, orthographic projections of the touch signal lines adjacent to each other comprised in a same touch signal line group on the base substrate are respectively provided on two sides of an orthographic projection of a same second signal line on the base substrate, each of the orthographic projections of the touch signal lines adjacent to each other and the orthographic projection of the same second signal line comprises a portion provided between orthographic projections of the touch electrodes adjacent to each other on the base substrate, and a layer in which the touch signal lines adjacent to each other are provided is different from a layer in which the same second signal line is provided.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "connect" or "interconnect" and the like are not limited to physical or mechanical connections, but may include electrical connections, whether direct or indirect. Expressions such as "up", "down", "left", "right" and the like are only used for expressing relative positional relationship, the relative positional relationship may be correspondingly changed in the case that the absolute position of a described object is changed.

Figure 1:
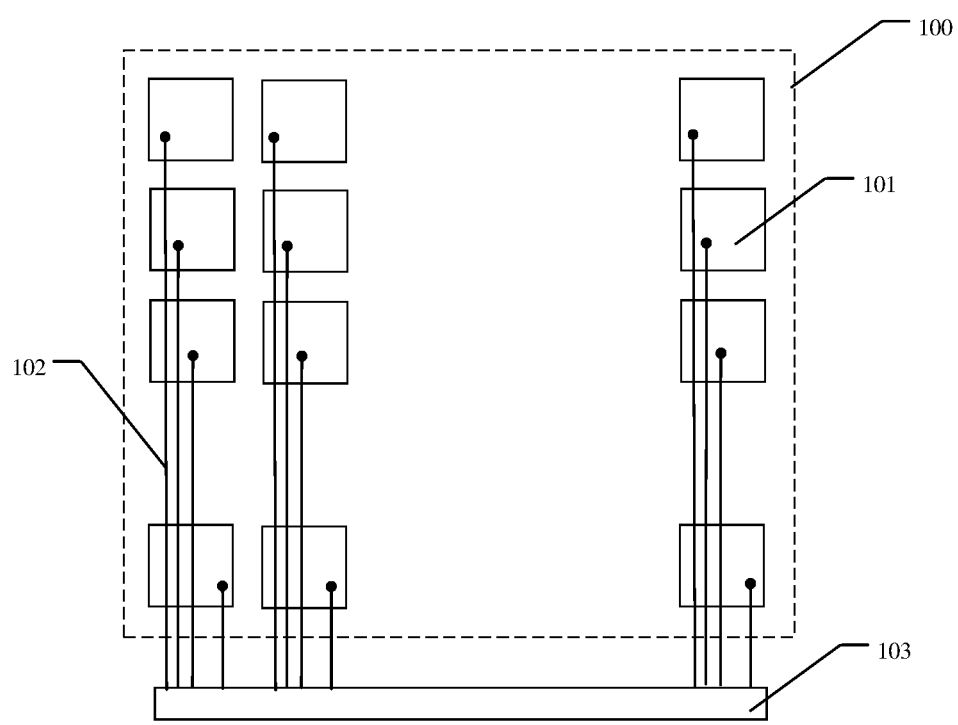
FIG. 1 is a schematic view of a touch structure of an in-cell touch screen using self-capacitance touch technology.

FIG. 1 is a schematic view of a touch structure of an in-cell touch screen using self-capacitance touch technology. As shown in FIG. 1, in the in-cell touch screen, the touch structure includes a plurality of touch sensing blocks 101 provided in an array, and a plurality of touch signal lines 102 electrically connected with the touch sensing blocks 101 respectively (black dots in FIG. 1 indicate electrical connections). The touch sensing blocks 101 are electrically connected to a touch control circuit 103 by the touch signal lines 102, and the touch control circuit detects changes of the self-capacitances of the touch sensing blocks 101 to determine the touch position. For example, an array substrate of the in-cell touch screen includes pixel electrodes and common electrodes and the common electrodes are also served as the touch sensing blocks 101, that is, in a display period, the common electrodes are applied with a common electrode signal, and in a touch period, the common electrodes are applied with a touch signal so that the common electrodes are used as the self-capacitance touch electrodes (each touch sensing block in FIG. 1 is a self-capacitance touch electrode).

Inventors of the present disclosure noticed that in the case that the touch structure shown in FIG. 1 is applied to a small-sized or medium-sized touch screen, one sub-pixel or several sub-pixels correspond to one touch signal line 102, the load is small. However, in the case that the touch structure shown in FIG. 1 is applied to a large-sized touch screen, the total number of the touch sensing blocks 101 and the total number of the touch signal lines 102 are large, resulting in a large load of the touch screen.

Embodiments of the present disclosure provide an array substrate, a manufacturing method thereof, and a touch display device including the array substrate. The array substrate comprises a base substrate, and a plurality of first signal lines, a plurality of second signal lines, a plurality of touch sensing blocks and a plurality of touch signal lines which are provided on the base substrate. Orthographic projections of the plurality of second signal lines on the base substrate intersect with orthographic projections of the plurality of first signal lines on the base substrate. The plurality of touch sensing blocks are spaced apart from each other, and each of the plurality of touch sensing blocks comprises a plurality of touch electrodes electrically connected with each other and spaced apart from each other. At least some of the plurality of touch signal lines are respectively electrically connected with the plurality of touch sensing blocks. The plurality of touch signal lines extend along an extension direction of the plurality of second signal lines, the plurality of touch signal lines are grouped into a plurality of touch signal line groups, each of the plurality of touch signal line groups comprises touch signal lines adjacent to each other, orthographic projections of the touch signal lines adjacent to each other included in a same touch signal line group on the base substrate are respectively provided on two sides of an orthographic projection of a same second signal line on the base substrate, each of the orthographic projections of the touch signal lines adjacent to each other included in the same touch signal line group and the orthographic projection of the same second signal line includes a portion provided between orthographic projections of the touch electrodes adjacent to each other on the base substrate, and a layer in which the touch signal lines adjacent to each other are provided is different from a layer in which the same second signal line is provided. In the embodiments of the present disclosure, because the layer in which the touch signal lines adjacent to each other are provided is different from the layer in which the second signal line between the touch signal lines adjacent to each other is provided, a distance between any one of the orthographic projections of the touch signal lines adjacent to each other and the orthographic projection of the second signal line between the touch signal lines adjacent to each other can be set to be relatively small, which facilitates to arrange the touch signal lines adjacent to each other and the second signal line between the touch signal lines adjacent to each other into a gap between the touch electrodes adjacent to each other. That is, the touch signal lines adjacent to each other and the second signal lines provided between the touch signal lines adjacent to each other can each include a portion provided between the touch electrodes adjacent to each other (i.e., the portion does not overlap with the touch electrodes adjacent to each other in a direction perpendicular to the base substrate), so as to reduce the load of the array substrate and improve the touch performance, especially in the case that the embodiments of the disclosure are applied to a large-sized (for example, 32 inches or larger than 32 inches; for example, 55 inches or larger than 55 inches) in-cell touch device, the load can be greatly reduced.

Figure 2A:
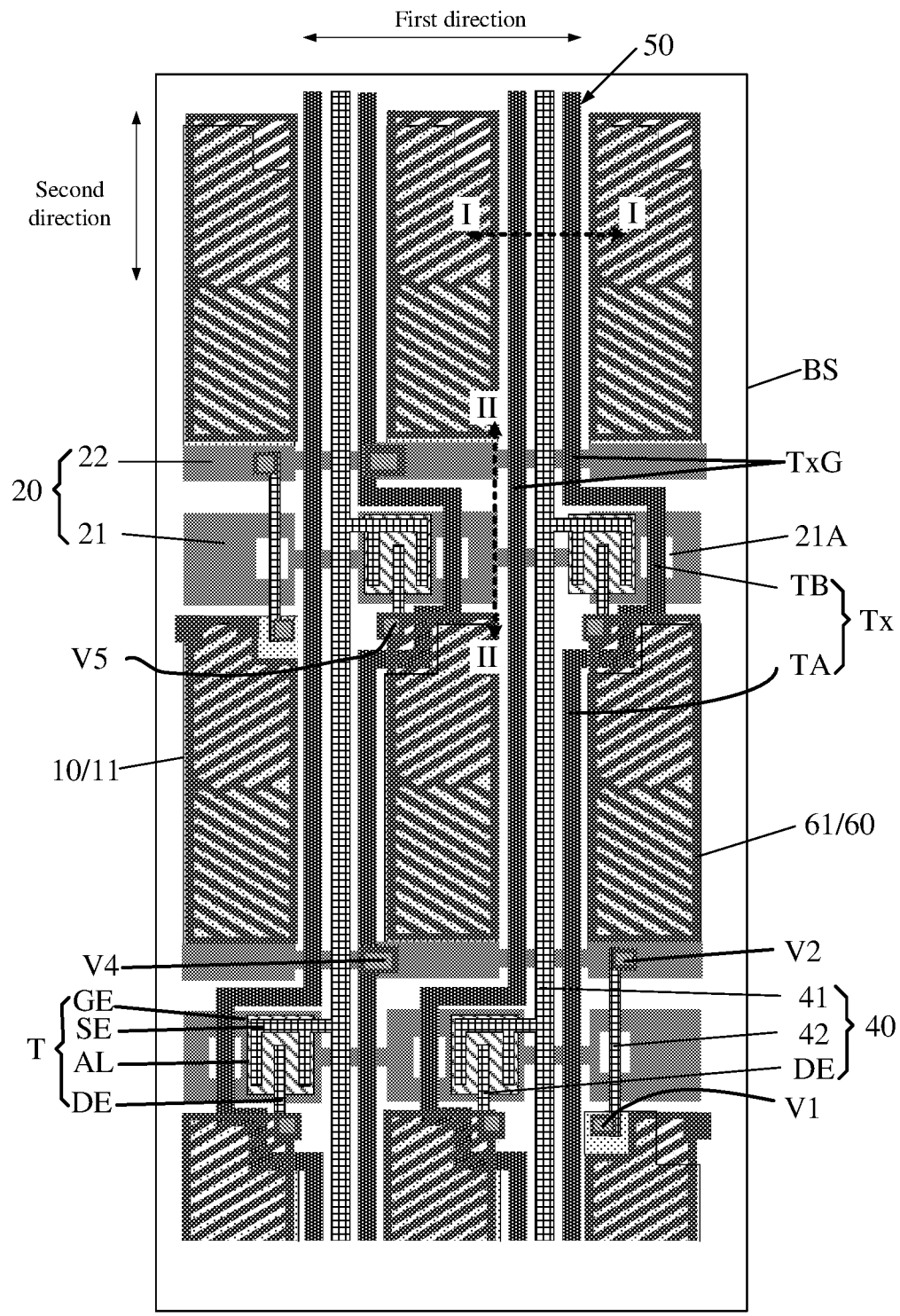
FIG. 2A is a schematic top view of an array substrate provided by at least one embodiment of the present disclosure.
Figure 2B:
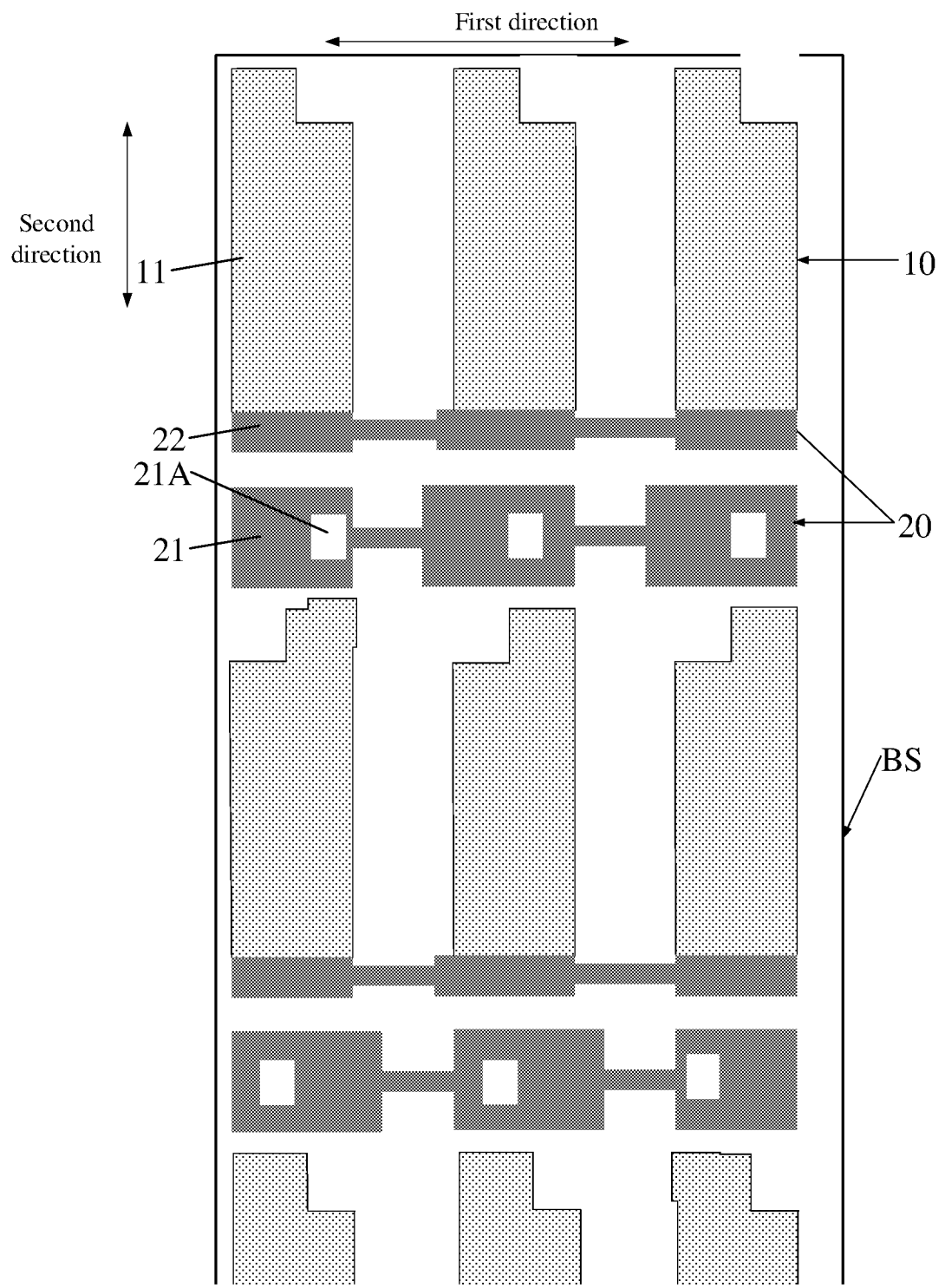
FIGS. 2B to 2D are schematic top views of some structures shown in FIG. 2A.
Figure 2C:
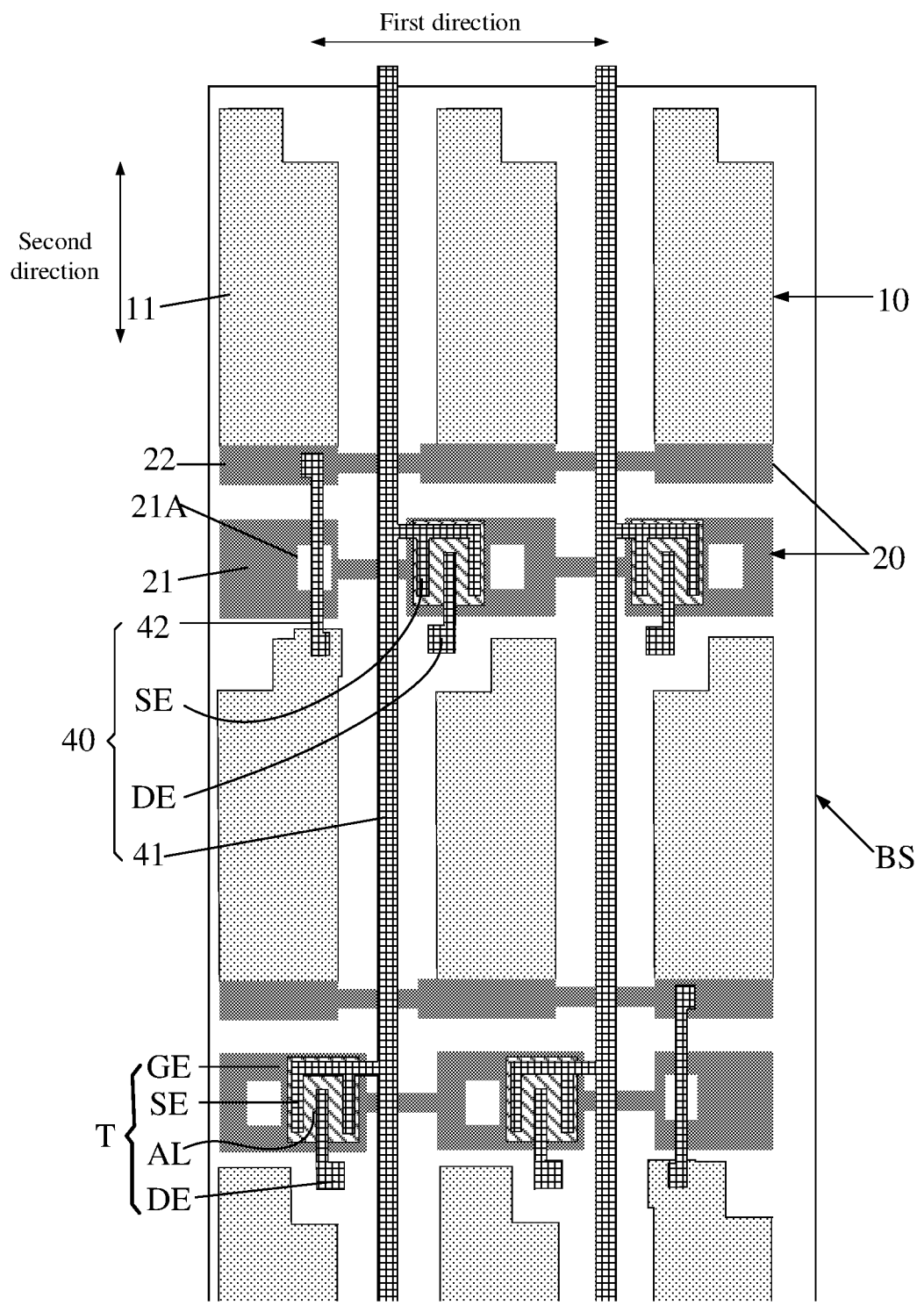
Figure 2D:
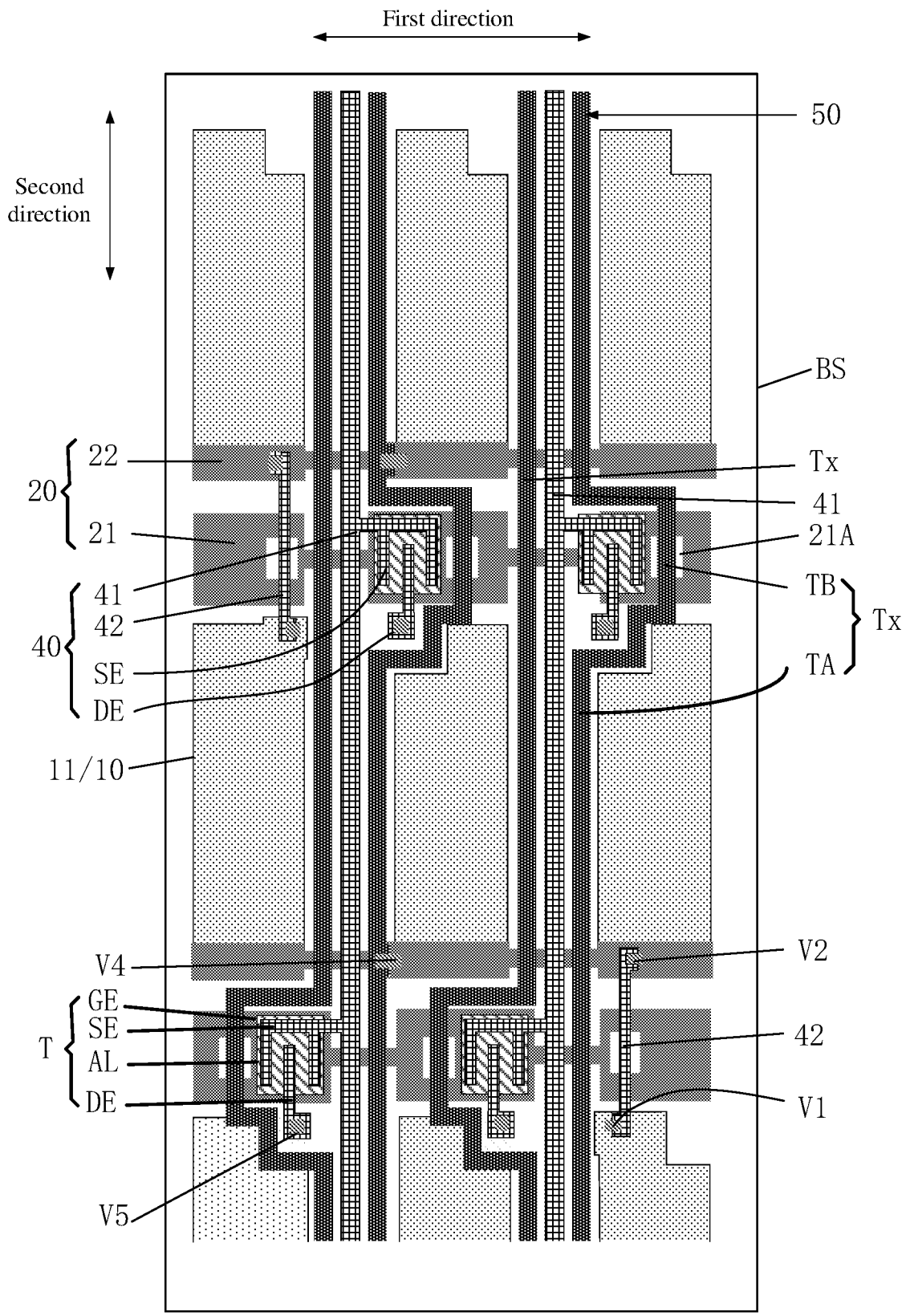
Figure 3A:
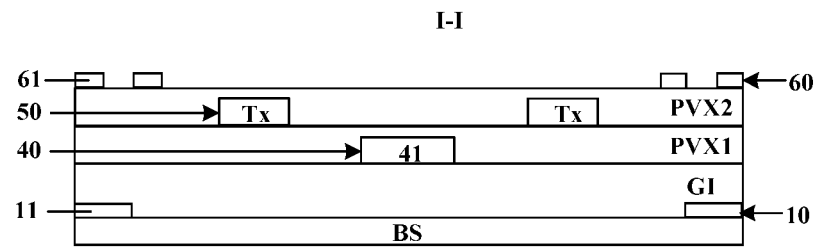
FIG. 3A is a simplified sectional schematic view taken along the line I-I in FIG. 2A.
Figure 3B:
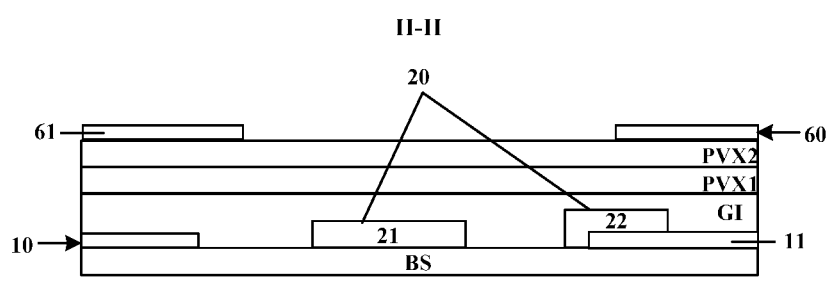
FIG. 3B is a simplified sectional schematic view taken along line II-II in FIG. 2A.

FIG. 2A is a schematic top view of the array substrate provided by at least one embodiment of the present disclosure; and FIGS. 2B to 2D are schematic top views of some structures shown in FIG. 2A. FIG. 2B shows a common electrode layer 10 and a first conductive layer 20 in FIG. 2A, FIG. 2C shows the common electrode layer 10, the first conductive layer 20 and a second conductive layer 40 in FIG. 2A, and FIG. 2D shows the common electrode layer 10, the first conductive layer 20, the second conductive layer 40 and a third conductive layer 50 in FIG. 2A. FIG. 3A is a simplified sectional schematic view taken along the line I-I in FIG. 2A; FIG. 3B is a simplified sectional schematic view taken along line II-II in FIG. 2A.

As shown in FIGS. 2A to 2D, the array substrate provided by at least one embodiment of the present disclosure includes a base substrate BS and a plurality of first signal lines 21 and a plurality of second signal lines 41 which are provided on the base substrate BS. The plurality of first signal lines 21 are provided in the first conductive layer 20, extend along a first direction, and are sequentially arranged along a second direction different from the first direction. The plurality of second signal lines 41 are provided in the second conductive layer 40, extend along the second direction and are sequentially arranged along the first direction. Orthographic projections of the second signal lines 41 on the base substrate BS intersect with orthographic projections of the first signal lines 21 on the base substrate BS. For example, the first signal line 21 has a first width at a position where the first signal line 21 overlaps with the second signal line 41 and a second width at a position between the second signal lines 41 adjacent to each other (that is, at a position where the first signal line 21 does not overlap with the second signal line 41), the first width and the second width are dimensions of the first signal line 21 in the second direction, and the first width is smaller than the second width. By providing the first signal line 21 have a smaller width at the position where the first signal line 21 overlaps with the second signal line 41, the overlapping area of the first signal line 21 and the second signal line 41 is reduced, so as to reduce the load of the array substrate.

For example, in some embodiments, as shown in FIGS. 2A to 2D, the first signal line 21 is a gate line and the second signal line 41 is a data line. In this case, as shown in FIGS. 3A and 3B, the first conductive layer 20 in which the first signal line 21 is provided and the second conductive layer 40 in which the second signal line 41 is provided are separated from each other by a gate insulating layer GI. For example, in some embodiments, the first signal line 21 is the data line and the second signal line 41 is the gate line. In the case that one of the first signal line 21 and the second signal line 41 is the gate line and the other of the first signal line 21 and the second signal line 41 is the data line, a region defined by intersecting the first signal lines 21 adjacent to each other and the second signal lines 41 adjacent to each other is a sub-pixel region, and the sub-pixel region includes an opening region and a non-opening region surrounding the opening region. In the array substrate provided by the embodiments of the disclosure, the non-opening region is a region shielded by a black matrix, and the opening region is a region not shielded by the black matrix. The first signal lines 21 adjacent to each other and the second signal lines 41 adjacent to each other are provided in the non-opening region. For example, the array substrate provided by at least one embodiment of the present disclosure is an array substrate used for realizing a display function. In this case, the sub-pixel region includes a display region (the opening region is the display region) and a non-display region surrounding the display region (the non-opening region is the non-display region), and the first signal lines 21 adjacent to each other and the second signal lines 41 adjacent to each other are provided in the non-display region of the sub-pixel region. The array substrate provided by the embodiments of the present disclosure may be an array substrate used for realizing other functions, which is not limited by the embodiments of the present disclosure. In the following embodiments, the array substrate is used to realize the display function as an example.

Referring to FIGS. 2A and 2D, the array substrate provided by at least one embodiment of the present disclosure further includes a plurality of touch signal lines Tx extending along the extension direction (i.e., the second direction) of the second signal lines 41 and sequentially arranged along the extension direction (i.e., the first direction) of the first signal lines 21. The plurality of touch signal lines Tx are grouped into a plurality of touch signal line groups TxG, and each touch signal line group TxG includes two touch signal lines Tx adjacent to each other (i.e., there is no other touch signal line Tx between the two touch signal lines Tx adjacent to each other). As shown in FIG. 2A, FIG. 2D and FIG. 3A, orthographic projections of the two touch signal lines Tx adjacent to each other on the base substrate BS are provided on two sides of an orthographic projection of a same second signal line 41 on the base substrate BS (i.e., the orthographic projection of the second signal line 41 is provided between the orthographic projections of the two touch signal lines Tx adjacent to each other). The touch signal lines Tx are provided in the third conductive layer 50, which is different from the first conductive layer 20 in which the first signal lines 21 are provided and the second conductive layer 40 in which the second signal lines 41 are provided. For example, as shown in FIG. 3A, the third conductive layer 50 is provided on a side of the second conductive layer 40 away from the base substrate BS, that is, the second conductive layer 40 is provided between the base substrate BS and the third conductive layer 50 in the direction perpendicular to the base substrate BS, and the second conductive layer 40 is separated from the third conductive layer 50 by a first passivation insulating layer PVX1, and the third conductive layer 50 is covered by a second passivation insulating layer PVX2. FIGS. 2A and 2D only shows two touch signal line groups TxG and two second signal lines 41 respectively corresponding to the two touch signal line groups TxG as an example. In some embodiments, in order to ensure the uniformity of electric fields on two sides of each of the plurality of second signal lines 41 in the array substrate, for example, the orthographic projection of each second signal line 41 is provided between the orthographic projections of two touch signal lines adjacent to each other Tx included in a same touch signal line group TXG.

On the one hand, because the orthographic projection of the second signal line 41 is provided between the orthographic projections of two touch signal lines Tx adjacent to the second signal line 41, a difference between the electric fields on two sides of the second signal line 41 can be reduced, which is beneficial to prevent the touch signal lines Tx from affecting the display effect of the display device using the array substrate. On the other hand, in the case that one of the three signal lines, i.e. the second signal line 41 and the two touch signal lines adjacent to the second signal line 41, fails and needs to be repaired, as compared the case that the second signal line 41 and the two touch signal lines Tx adjacent to the second signal line 41 are provided in a same layer, it is possible to avoid short circuit among the three signal lines and facilitate repairing of the failed signal line by adopting the arrangement in which the third conductive layer 50 in which the two touch signal lines Tx adjacent to each other are provided is different from the second conductive layer 40 in which the second signal line 41 is provided. On another hand, because the third conductive layer 50 in which the two touch signal lines Tx adjacent to each other are provided is different from the second conductive layer 40 in which the second signal line 41 is provided, the distance between any of the orthographic projections of the two touch signal lines Tx adjacent to each other and the orthographic projection of the second signal line 41 can be set to be relatively small; in this case, by arranging the two touch signal lines Tx adjacent to each other and the same second signal line 41 in the non-opening region of the sub-pixel region, the aperture ratio of the array substrate can be improved.

With continued reference to FIGS. 2A to 2D, the array substrate provided by at least one embodiment of the present disclosure further includes touch electrodes 11 spaced apart from each other and provided on the base substrate BS. For example, the touch electrodes 11 are also used as common electrodes in the array substrate, that is to say, the common electrodes included in the array substrate are multiplexed as the touch electrodes 11; the display function is realized by applying a common electrode signal to the common electrodes in the display period, and the touch function is realized by applying a touch signal to the common electrodes in the touch period. For example, the array substrate includes the common electrodes and pixel electrodes. For example, as shown in FIGS. 2A, 3A and 3B, the array substrate provided by at least one embodiment of the present disclosure includes the common electrodes (i.e., the touch electrodes 11) and the pixel electrodes 61 provided on the base substrate BS, the common electrodes are provided in a common electrode layer 10 and the pixel electrodes 61 are provided in a pixel electrode layer 60, that is, the common electrodes are provided in a layer different from the layer in which the pixel electrodes 61 are provided.

In some embodiments, the pixel electrode layer 60 is provided between the base substrate BS and the common electrode layer 10 in the direction perpendicular to the base substrate BS (as shown in FIGS. 6A to 7B); in this case, each of the touch electrodes 11 in the common electrode layer farther from the base substrate BS has a plurality of slits that penetrate through the touch electrode 11. In other embodiments, as shown in FIGS. 3A and 3B, the common electrode layer 10 is provided between the base substrate BS and the pixel electrode layer 60 in the direction perpendicular to the base substrate BS; in this case, as shown in FIGS. 2A to 2D, each of the touch electrodes 11 has a solid structure without slits, and each of the pixel electrodes 61 has a plurality of slits (FIGS. 2A to 2D illustrate that each pixel electrode has slits in two different directions to form a dual-domain structure as an example, and in other embodiments, each pixel electrode 61 may have a single domain or multiple-domain structure). In the case that each touch electrode 11 does not have the slit, each touch electrode 11 has a larger area, which is beneficial to enhance the touch performance. In addition, because the touch electrode 11 is closer to the base substrate BS and has the larger area, a double-sided touch mode can be realized. That is, in the front touch mode, a touch object (e.g., a user's finger) touches the side of the base substrate BS provided with the touch electrodes 11; in the back touch mode, the touch object touches the side of the base substrate BS not provided with the touch electrodes 11.

For example, as shown in FIGS. 2A to 2D, the plurality of first signal lines 21 and the plurality of second signal lines 41 in the array substrate intersect with each other to form a plurality of sub-pixel regions, each sub-pixel region is a region defined by adjacent first signal lines 21 and adjacent second signal lines 41, each sub-pixel region is provided with one touch electrode 11, and each touch electrode 11 is provided in one sub-pixel region. That is to say, the plurality of sub-pixel regions and the plurality of touch electrodes 11 in the array substrate are provided in one-to-one correspondence manner. In this case, one second signal line 41 is provided between touch electrodes adjacent to each other 11 in the first direction (i.e. the extension direction of the first signal line 21). It should be noted that in FIGS. 2A to 2D, the touch electrodes 11 are closer to the base substrate BS than the pixel electrodes 61. In other embodiments, in the case that the pixel electrodes 61 are closer to the base substrate BS than the touch electrodes 11, the touch electrodes 11 and the sub-pixel regions are also provided in a one-to-one correspondence manner to reduce the overlapping area between the touch electrodes 11 and the second signal lines 41, thereby reducing the load of the array substrate.

As shown in FIG. 2A, FIG. 2D and FIG. 3A, each of the orthographic projections of the two touch signal lines Tx adjacent to each other included in the same touch signal line group TxG and the orthographic projection of the second signal line 41 provided between the two touch signal lines Tx adjacent to each other includes the portion provided between the orthographic projections of the touch electrodes 11 adjacent to each other on the base substrate BS. By providing this portion between the orthographic projections of the touch electrodes 11 adjacent to each other without overlapping with the orthographic projections of touch electrodes 11, the load of the array substrate can be effectively reduced. Especially, in the case that the array substrate is an array substrate used in a large-size display device, the load of the array substrate is greatly reduced.

It should be noted that: "each of the orthographic projections of the two touch signal lines Tx adjacent to each other and the orthographic projection of the second signal line 41 provided between the two touch signal lines Tx adjacent to each other includes the portion provided between the orthographic projections of the touch electrodes 11 adjacent to each other on the base substrate BS", means that an entirety or a part of the orthographic projection of any one of the three signal lines (i.e. the two touch signal lines Tx adjacent to each other and the second signal line 41 provided between the two touch signal lines Tx adjacent to each other) does not overlap with the touch electrodes 11. For example, as shown in FIGS. 2A and 2D, each touch signal line Tx includes a plurality of main portions TA and a plurality of bent portions TB, the plurality of main portions TA and the plurality of bent portions TB are alternately provided; the orthographic projection of each main portion TA on the base substrate BS is provided in the region between the orthographic projections of the touch electrodes 11 adjacent to each other in the first direction on the base substrate BS. In this case, the main portion TA of each of the adjacent touch signal lines Tx and the second signal line 41 provided between the main portions TA of the adjacent touch signal lines Tx are provided between the touch electrodes 11 adjacent to each other in the first direction. Because the main portion TA is the main part of the touch signal line Tx and at least the orthographic projection of the main portion TA does not overlap with the orthographic projection of the touch electrode 11, the load of the array substrate can be effectively reduced. In other embodiments, on the basis that the orthogonal projection of the main portion TA does not overlap with the orthogonal projection of the touch electrode 11, the orthogonal projection of the bent portion TB does not overlap with the orthogonal projection of the touch electrode 11, that is, the entirety of the orthogonal projection of the touch signal line Tx is provided in the region between the orthogonal projections of touch electrodes 11 adjacent to each other.

For example, as shown in FIGS. 2A and 2D, the first signal line 21 has the above-mentioned first width at a position where the main portion TA of the touch signal line Tx overlaps with the first signal line 21. The load of the array substrate can be further reduced by designing the first signal line 21 to have a smaller width at the position where the main portion TA of the touch signal line Tx overlaps with the first signal line 21.

The orthographic projection of the touch signal line Tx on the base substrate BS overlaps with or does not overlap with the orthographic projection of the pixel electrode 61 on the base substrate BS. For example, as shown in FIG. 2A, the orthographic projection of the main portion TA of the touch signal line Tx does not overlap with the orthographic projection of the pixel electrode 61, and the orthographic projection of the bent portion TB of the touch signal line Tx overlaps with the orthographic projection of the pixel electrode 61. In other embodiments, the orthographic projections of the main portion TA and the bent portion TB of the touch signal line Tx both overlap the orthographic projection of the pixel electrode 61, so as to increase the pixel capacitance and thus improve the pixel charging efficiency.

The bent portion TB included in the touch signal line Tx is used to avoid the touch signal line Tx from overlapping with the switching elements included in the array substrate, thereby further reducing the load of the array substrate. For example, as shown in FIGS. 2A and 2D, the array substrate provided by at least one embodiment of the present disclosure includes a plurality of switching elements T provided on the base substrate BS, each switching element T is provided in a region between the bent portion TB and the second signal line 41 closest to the bent portion TB, and the switching element T is electrically connected with the pixel electrode 61. For example, the switching element is a transistor, which includes a gate electrode GE, an active layer AL, a source electrode SE and a drain electrode DE, and the drain electrode DE is electrically connected to the pixel electrode 61 (for example, the drain electrode DE is electrically connected to the pixel electrode 61 through a via hole V5). For example, the gate electrode GE is a part of the first signal line 21, the source electrode SE is directly electrically connected with the second signal line 41, and the source electrode SE and the drain electrode DE are provided in a same conductive layer, which can simplify the manufacturing process of the array substrate.

Figure 6A:
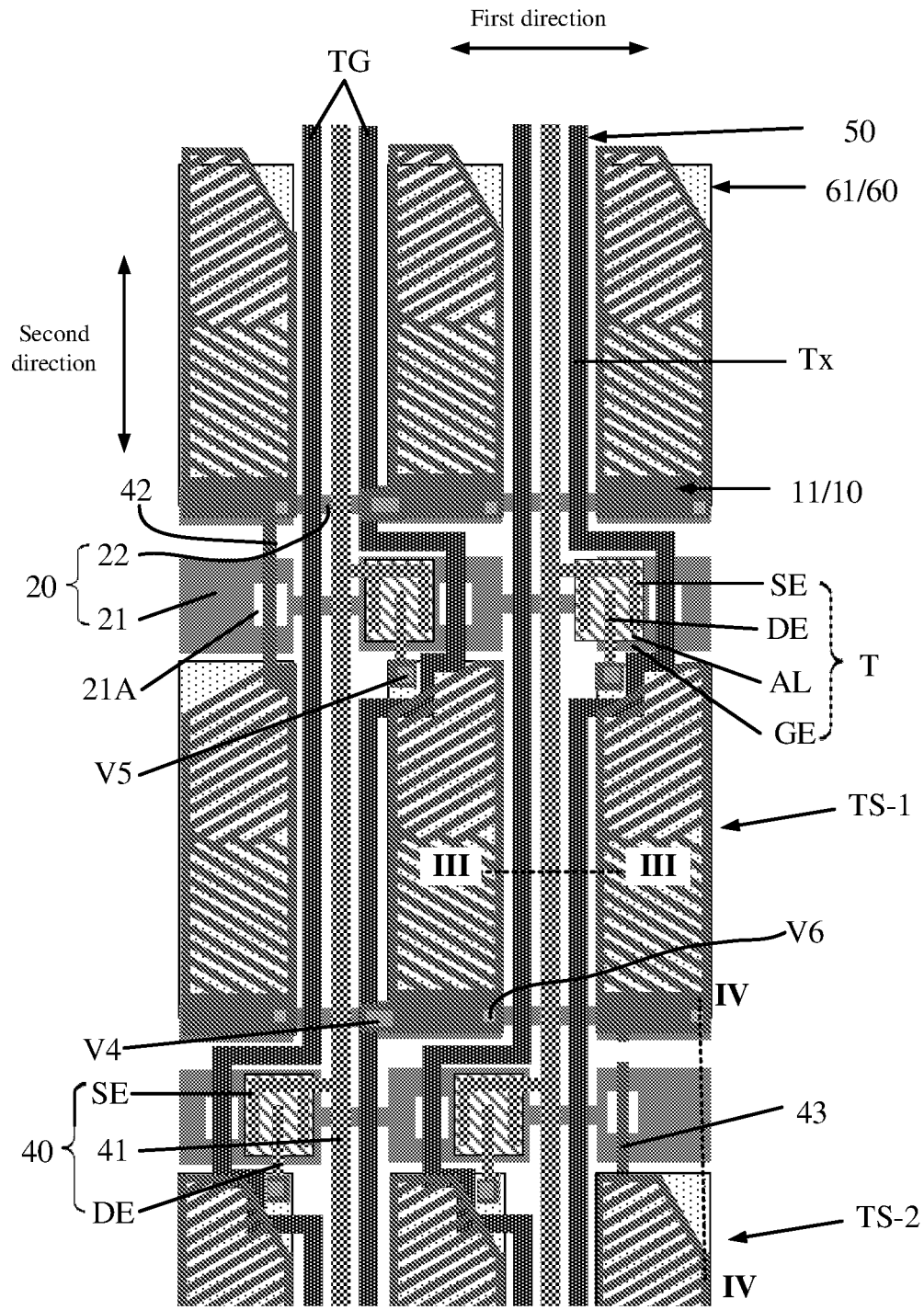
FIG. 6A is another schematic top view of the array substrate provided by at least one embodiment of the present disclosure.

For example, as shown in FIGS. 2A to 2D, the first signal line 21 comprises a plurality of openings 21A, and the orthographic projections of some of the openings 21A on the base substrate BS respectively overlap with the orthographic projections of the bent portions TB on the base substrate BS. The opening 21A is an opening penetrating through the first signal line 21. By providing the opening 21A and designing that the orthographic projection of each bent portion TB overlaps with the orthographic projection of the opening 21A, the overlapping area between the first signal line 21 and the touch signal line Tx can be reduced, thereby further reducing the load of the array substrate. For example, in some embodiments, the orthographic projection of each opening 21A overlaps with the orthographic projection of one bent portion TB. For example, in other embodiments, on the basis that the orthographic projections of some of the openings 21A respectively overlap with the orthographic projections of the bent portions TB on the base substrate BS, the orthographic projections of another of the openings 21A on the base substrate BS respectively overlap with the orthographic projections of second extension portions 42 mentioned below (as shown in FIGS. 2A and 6A) on the base substrate BS to further reduce the load. For example, in other embodiments, the orthographic projections of third extension portions 43 mentioned below on the base substrate BS respectively overlap with the orthographic projections of still another of the openings 21A on the base substrate BS to further reduce the load.

In at least one embodiment of the present disclosure, the plurality of touch electrodes 11 in the array substrate are grouped into a plurality of touch sensing blocks, the touch electrodes 11 in each touch sensing block are electrically connected with each other, and each touch sensing block is electrically connected with one touch signal line Tx.

Figure 4A:
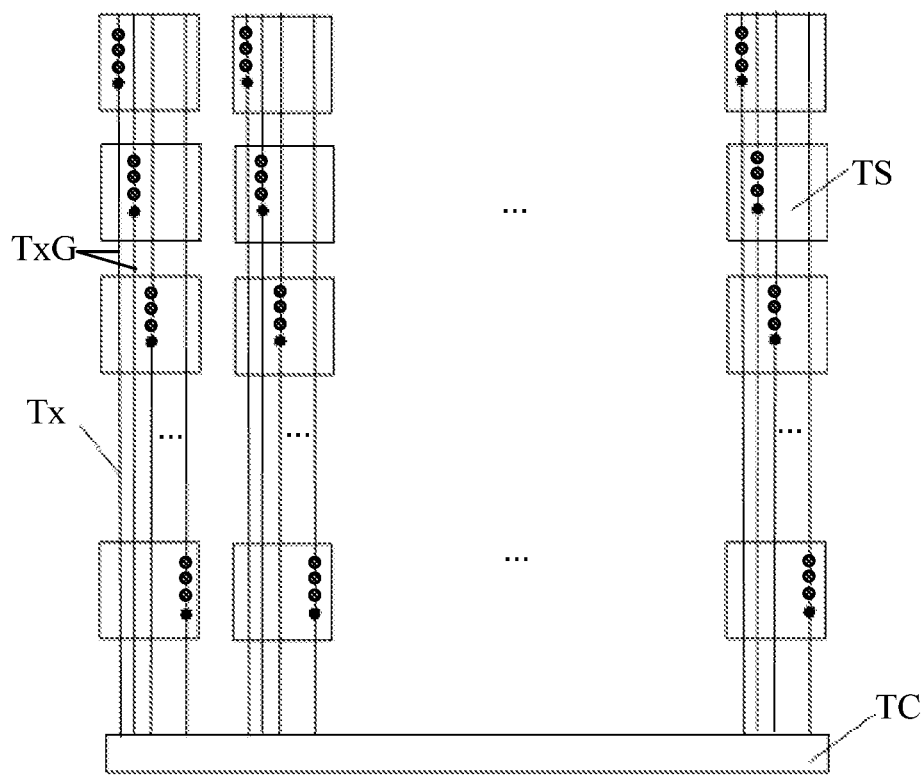
FIG. 4A is a schematic view of an electrical connection relationship between a plurality of touch sensing blocks and a plurality of touch signal lines in the array substrate according to at least one embodiment of the present disclosure.
Figure 4B:
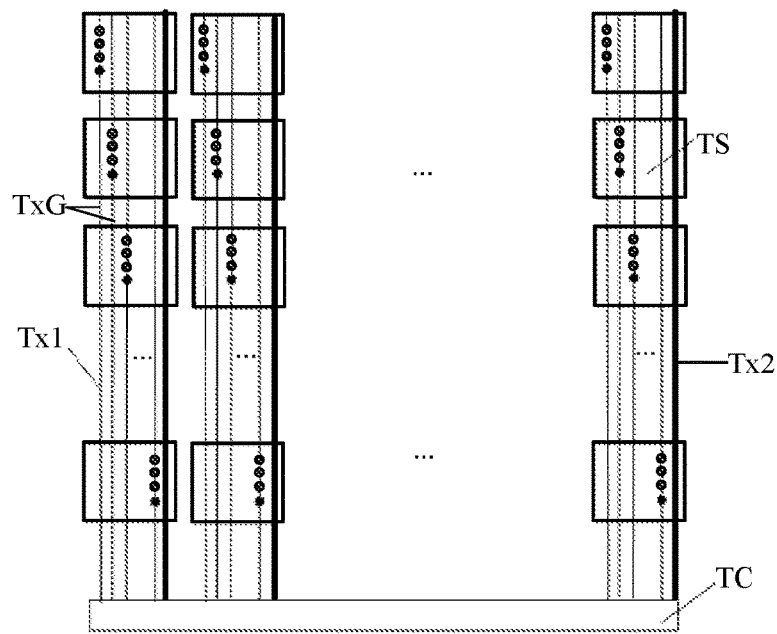
FIG. 4B is another schematic view of the electrical connection relationship between the plurality of touch sensing blocks and the plurality of touch signal lines in the array substrate according to at least one embodiment of the present disclosure.
Figure 4C:
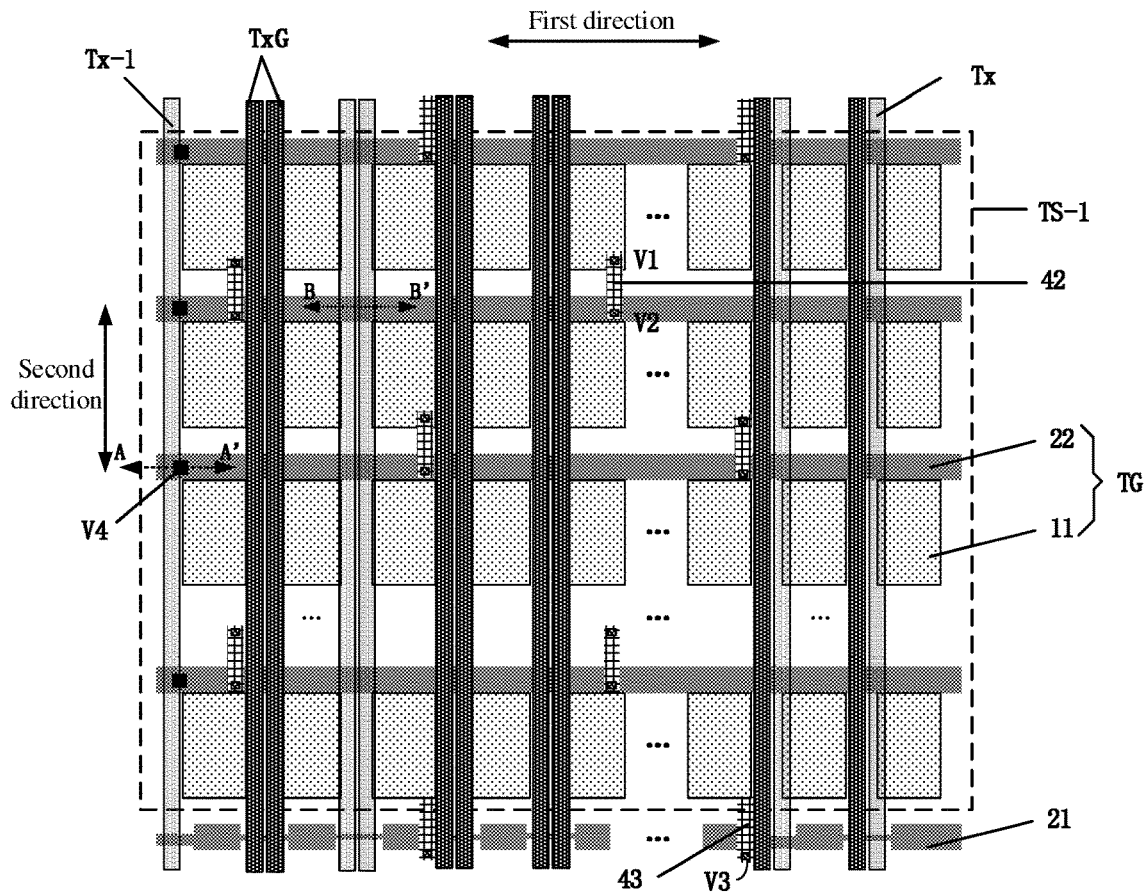
FIG. 4C is a schematic view of a positional relationship between a single touch sensing block and some of the touch signal lines in the array substrate according to at least one embodiment of the present disclosure.
Figure 4D:
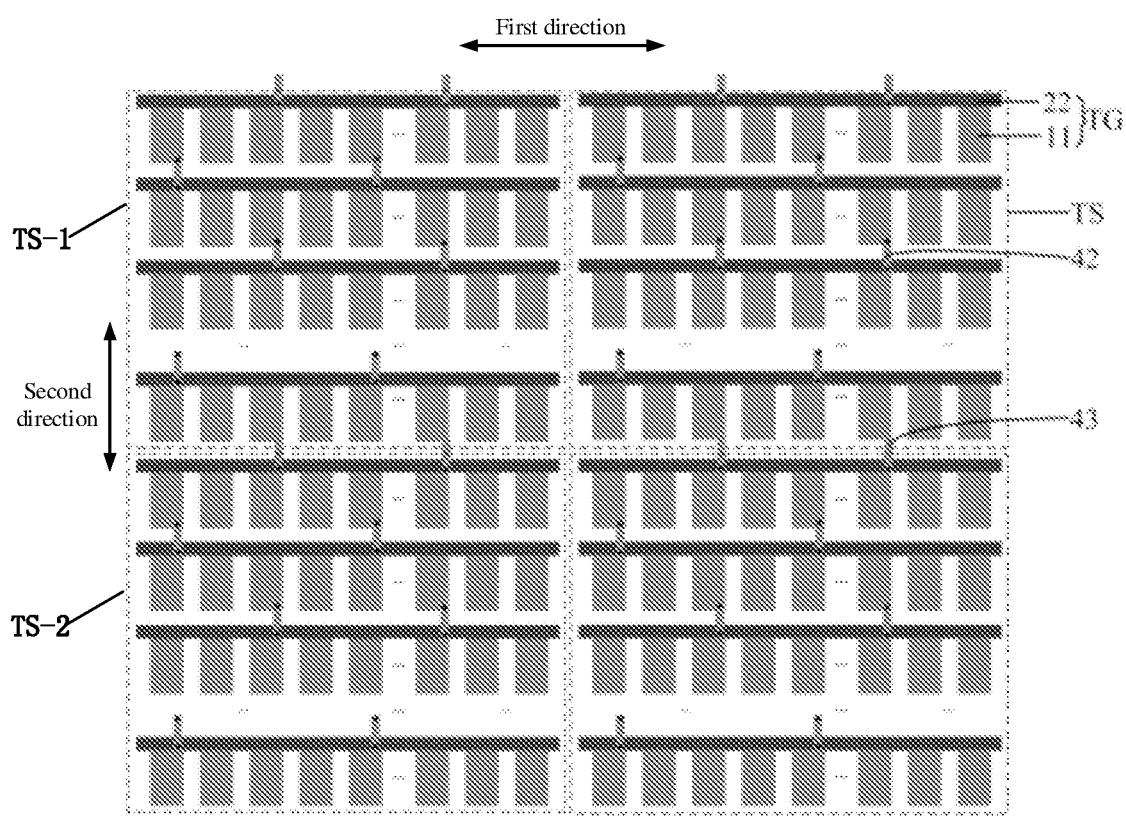
FIG. 4D is a schematic top view of the plurality of touch sensing blocks in the array substrate provided by at least one embodiment of the present disclosure.
Figure 4E:
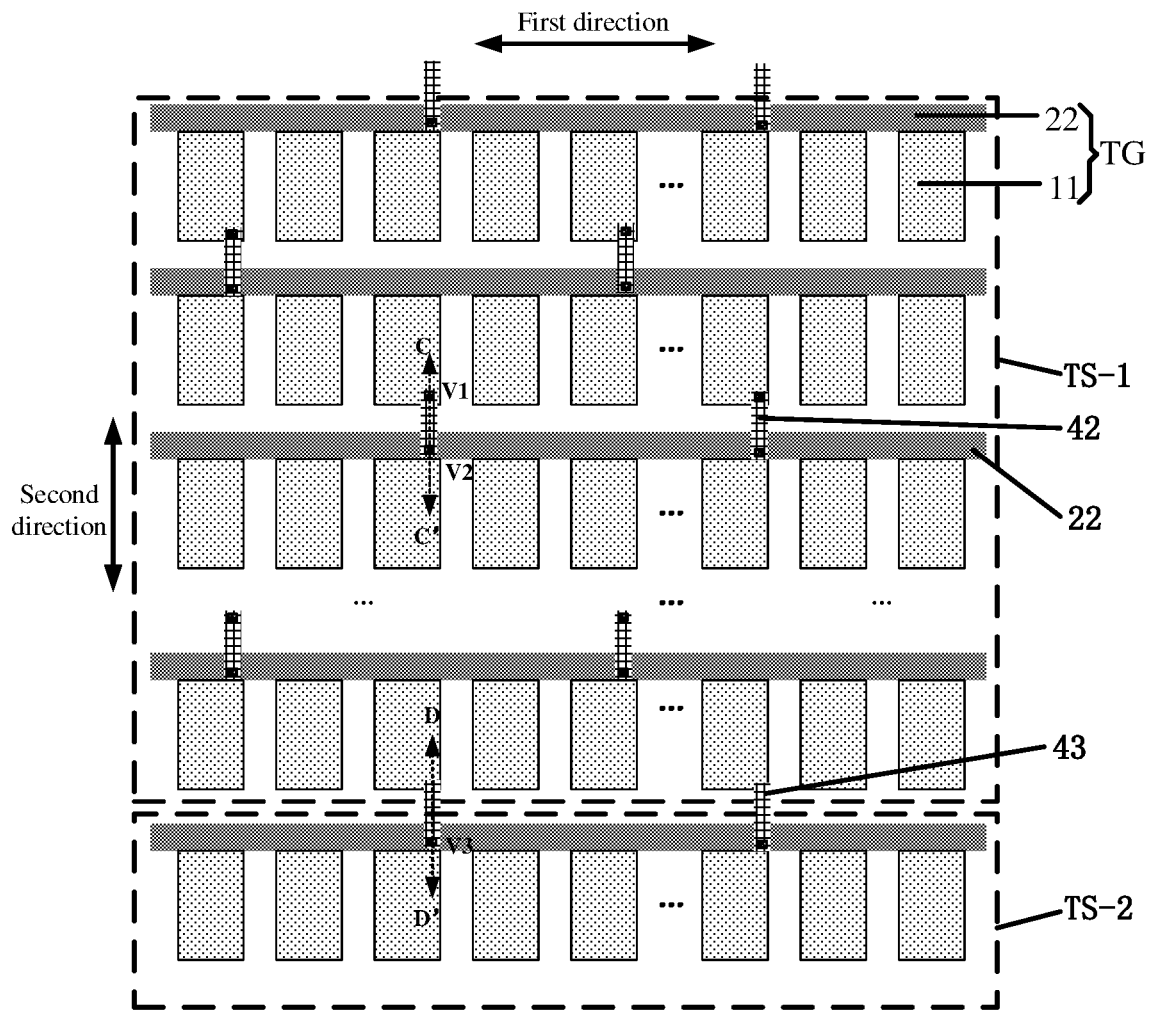
FIG. 4E is a partially enlarged schematic view of FIG. 4D.

FIG. 4A is a schematic view of an electrical connection relationship between the plurality of touch sensing blocks and the plurality of touch signal lines in the array substrate according to at least one embodiment of the present disclosure, and each black dot in FIG. 4A represents a via hole for electrical connection; FIG. 4B is another schematic view of the electrical connection relationship between the plurality of touch sensing blocks and the plurality of touch signal lines in the array substrate according to at least one embodiment of the present disclosure; FIG. 4C is a schematic view of a positional relationship between a single touch sensing block and some of the touch signal lines in the array substrate according to at least one embodiment of the present disclosure; FIG. 4D is a schematic top view of the plurality of touch sensing blocks in the array substrate provided by at least one embodiment of the present disclosure, and the embodiment shown in FIG. 4D shows two rows and two columns of touch sensing blocks TS for illustration; FIG. 4E is a partially enlarged schematic view of FIG. 4D.

As shown in FIGS. 4A to 4E, the array substrate provided by at least one embodiment of the present disclosure includes the plurality of touch sensing blocks TS provided on the base substrate and spaced apart from each other, each touch sensing block TS includes the touch electrodes 11 electrically connected to each other and spaced apart from each other, and each touch sensing block TS is electrically connected with one touch signal line Tx so that each touch sensing block TS is electrically connected with a touch control circuit TC by the one touch signal line Tx. For example, the array substrate provided by at least one embodiment of the present disclosure adopts the self-capacitance principle to realize touch control, that is, each touch sensing block TS serves as a self-capacitance electrode, and the touch control circuit TC determines the touch position by detecting the change of the self-capacitance of the touch sensing block TS.

For example, as shown in FIG. 4A, each touch sensing block TS is electrically connected to only one touch signal line Tx, and each touch signal line is electrically connected to only one touch sensing block TS. That is, the plurality of touch sensing blocks TS in the array substrate are electrically connected with the plurality of touch signal lines Tx in one-to-one correspondence manner. It should be noted that the electrical connection relationship between the touch sensing blocks TS and the touch signal lines Tx is not limited to the manner shown in FIG. 4A. For example, in some embodiments, as shown in FIG. 4B, the total number of the touch signal lines Tx is greater than the total number of the touch sensing blocks TS in the array substrate. For example, the plurality of touch signal lines Tx in the array substrate include a plurality of first touch signal lines Tx1 and a plurality of second touch signal lines Tx2, the plurality of first touch signal lines Tx1 and the plurality of second touch signal lines Tx2 are electrically connected with the touch control circuit TC and are applied with the same touch signal during operation, the plurality of first touch signal lines Tx1 are respectively electrically connected with the plurality of touch sensing blocks TS, and the plurality of second touch signal lines Tx2 are insulated from the plurality of touch sensing blocks TS. In some embodiments of the present disclosure, each second signal line 41 is provided between two touch signal lines Tx adjacent to each other, so that in the case that the total number of the second signal lines 41 is relatively large, the total number of the touch signal lines Tx that need to be provided is also relatively large. If the total number of the touch signal lines Tx is set to be equal to the total number of the touch sensing blocks TS, then there exists a case that a part of the second signal lines 41 are not provided between the two touch signal lines Tx adjacent to each other. In view of this, in some embodiments of the present disclosure, the second touch signal lines Tx2 electrically insulated from any one of the touch sensing blocks TS are provided, so that the total number of the touch signal lines Tx is larger than the total number of the touch sensing blocks TS, and each second signal line 41 is provided between two touch signal lines Tx adjacent to each other.

It should be noted that in FIG. 4B, in order to distinguish the first touch signal line Tx1 from the second touch signal line Tx2, lines with different thicknesses are used to respectively represent the first touch signal line Tx1 and the second touch signal line Tx2. However, in the embodiments of the present disclosure, the first touch signal line Tx1 and the second signal line Tx2 have the same width in the first direction.

For example, as shown in FIG. 4C, multiple touch signal line groups TxG (for example, each touch signal line group TxG is provided in a gap between two touch electrodes adjacent to each other 11) pass through a region in which the touch sensing block TS-1 is provided, one touch signal line Tx (see Tx-1 in FIG. 4C) of the multiple touch signal line groups TxG is electrically connected with the touch sensing block TS-1, and the other touch signal lines Tx of the multiple touch signal line groups TxG are insulated from the touch sensing block TS-1. For example, the touch signal line Tx-1 is electrically connected to a plurality of first extension portions 22 included in the touch sensing block TS-1 (the arrangement manner of the first extension portions 22 will be described in detail below). For example, the first extension portions 22 are electrically connected to the same touch signal line Tx-1 through via holes V4 (see FIGS. 4C and 2A). By electrically connecting the touch signal line Tx (see Tx-1) with the plurality of first extension portions 22 included in the same touch sensing block TS-1, the signal transmission speed can be increased, and the occurrence probability of poor electrical connection between the touch signal line Tx and the touch sensing block TS can be reduced. It should be noted that the electrical connection between the touch sensing block TS and its corresponding touch signal line Tx is not limited to the manner shown in FIG. 4C, as long as the electrical connection between the touch sensing block TS and its corresponding touch signal line Tx can be realized. In addition, for the convenience of explaining the positional relationship between the touch sensing block TS and the touch signal lines Tx, FIG. 4C only exemplarily shows one touch sensing block TS and the multiple touch signal lines Tx passing through the touch sensing block, but does not show the second signal line between the two touch signal lines Tx adjacent to each other included in the same touch signal line group TxG.

For example, as shown in FIGS. 4D to 4E, each touch sensing block TS includes a plurality of touch electrode groups TG arranged sequentially, and each touch electrode group TG includes a plurality of touch electrodes 11 spaced apart from each other and a first extension portion 22 electrically connected with the plurality of touch electrodes 11. For example, as shown in FIG. 3B, the first extension 22 is directly electrically connected with the touch electrode 11 (i.e., the electrical connection therebetween is not realized by a via hole or a relay conductive element). For example, as shown in FIGS. 4D to 4E, the plurality of touch electrode groups TG included in the same touch sensing block TS extend along the first direction and are sequentially arranged along the second direction, and accordingly, the first extension portions 22 of the plurality of touch electrode groups TG extend along the first direction and are sequentially arranged along the second direction. Each touch sensing block TS further includes a plurality of second extension portions 42, and each second extension portion 42 is provided between and electrically connected to touch electrode groups TG adjacent to each other. For example, each second extension portion 42 extends in the second direction, and each second extension portion 42 is electrically connected with two touch electrode groups TG adjacent to each other through a first via hole V1 and a second via hole V2 (see FIGS. 4C-4E and 2A), respectively. For example, the touch electrode groups TG adjacent to each other are electrically connected with each other by at least two second extension portions 42, which can improve the signal transmission speed. For example, in order to obtain a better signal transmission speed, in the first direction, at most every six sub-pixel regions corresponds to one second extension portion 42. For example, as shown in FIG. 4D, every four sub-pixel regions correspond to one second extension portion 42 in the first direction.

In the embodiments of the present disclosure, on the one hand, each touch sensing block TS includes the touch electrodes 11 spaced apart from each other and at least a portion of the touch signal line Tx and at least a portion of the second signal line 41 are provided in a region between two touch electrodes adjacent to each other 11, the load of the array substrate can be effectively reduced. On the other hand, the touch sensing block TS is obtained by electrically connecting the plurality of touch electrodes 11 spaced apart from each other by using the first extension portions 22 and the second extension portions 42, so that the touch sensing block TS has a grid-like structure, and thus the resistance of the touch sensing block TS is small.

For example, each of the first extension portion 22 and the second extension portion 42 is provided in the non-opening region of the array substrate to improve the aperture ratio of the array substrate.

For example, as shown in FIGS. 2A to 2D, the first extension portion 22 has a first width at positions where the first extension portion 22 respectively overlaps with the second signal line 41 and the touch signal lines Tx, and has a second width between adjacent second signal lines 41, the first width and the second width are dimensions of the first extension portion 22 in the second direction, and the first width is smaller than the second width. The first extension portion 22 have a smaller width at positions where the first extension portion 22 respectively overlaps with the second signal line 41 and the touch signal line Tx, so that the load of the array substrate is further reduced.

For example, as shown in FIG. 2A, FIG. 2C and FIG. 2D, the orthographic projection of the second extension portion 42 on the base substrate overlaps with the opening 21A in the first signal line 21 to further reduce the load of the array substrate.

For example, as shown in FIGS. 2A-2D, the first extension portion 22 and the first signal line 21 are provided in a same layer (see the first conductive layer 20), that is, the first extension portion 22 and the first signal line 21 are formed by patterning a same film with a same mask, which can simplify the manufacturing process of the array substrate.

For example, as shown in FIG. 2A, FIG. 2C and FIG. 2D, the second extension portion 42 and the second signal line 41 are provided in a same layer (see the second conductive layer 40), that is, the second extension portion 42 and the second signal line 41 are formed by patterning a same film with a same mask, which can simplify the manufacturing process of the array substrate.

It should be noted that one first signal line 21 is provided between the touch electrode groups TG adjacent to each other included in the same touch sensing block TS, and one first signal line 21 is provided between the touch sensing blocks TS adjacent to each other in the second direction (that is, the extension direction of the second signal line 41). In order to explain the positional relationship between the touch sensing block TS and the touch signal line Tx, FIG. 4C does not show the first signal line 21 provided between the touch electrode groups TG adjacent to each other included in the same touch sensing block TS, but only shows one touch sensing block TS and one first signal line 21 provided between the touch sensing blocks TS adjacent to each other. In order to facilitate the explanation of the structure of the touch sensing block TS, the first signal line 21 is not shown in FIGS. 4D and 4E.

For example, as shown in FIGS. 4C to 4E, a third extension portion 43 is provided between the touch sensing blocks TS-1 and TS-2 adjacent to each other in the second direction, and the third extension portion 43 is electrically connected with one of the touch sensing blocks TS-1 and TS-2 adjacent to each other and is electrically insulated from the other of the touch sensing blocks TS-1 and TS-2 adjacent to each other. For example, the third extension portion 43 is electrically connected with the touch sensing block TS-2 (see FIGS. 4D and 4E) for example by a third via hole V3, and the third extension portion 43 is electrically insulated from the touch sensing block TS-1. As shown in FIG. 4C, one first signal line 21 is provided between the touch sensing blocks TS-1 and TS-2 adjacent to each other in the second direction (FIG. 4C only shows the touch sensing block TS-1), the orthographic projection of the third extension portion 43 provided between the touch sensing blocks TS-1 and TS-2 adjacent to each other on the base substrate BS overlaps with the orthographic projection of the first signal line 21 provided between the touch sensing blocks TS-1 and TS-2 adjacent to each other on the base substrate In the embodiments of the present disclosure, on the one hand, the first extension portions 22 of the touch sensing blocks TS adjacent to each other in the first direction are disconnected from each other (for example, the distance between the first extension portions 22 of the touch sensing blocks TS adjacent to each other in the first direction is greater than or equal to 5 microns), so that the touch sensing blocks TS adjacent to each other are electrically insulated from each other in the first direction; in addition, the touch sensing blocks TS adjacent to each other in the second direction are electrically insulated from each other because of the third extension portion 43. On the other hand, one first signal line 21 is provided between the touch electrode groups TG adjacent to each other in the same touch sensing block TS, so that the orthographic projection of the second extension portion 42 electrically connecting the touch electrode groups TG adjacent to each other on the base substrate BS overlaps with the orthographic projection of the first signal line 21 on the base substrate BS; the third extension portion 43 is provided between the touch sensing blocks TS-1 and TS-2 adjacent to each other, the third extension portion 43 is electrically connected with the touch sensing block TS-2 and electrically insulated from the touch sensing block TS-1, and the third extension portion 43 overlaps with the first signal line 21 provided between the touch sensing blocks TS-1 and TS-2 adjacent to each other, so that the first signal line 21 provided between touch electrode groups TG adjacent to each other of the same touch sensing block TS and the first signal line 21 provided between the touch sensing blocks TS-1 and TS-2 adjacent to each other have parasitic capacitances substantially equal to each other, and the uniformity of the parasitic capacitances of the first signal lines 21 of the array substrate is improved. For example, in order to further improve the uniformity of the parasitic capacitances of the plurality of first signal lines 21, the total number of the second extension portions 42 provided between the touch electrode groups TG adjacent to each other of the same touch sensing block TS is equal to the total number of the third extension portions 43 provided between the touch sensing blocks TS-1 and TS-2 adjacent to each other in the second direction.

For example, as shown in FIGS. 2A, 2C and 2D, the second extension portion 42 and the third extension portion 43 are provided in a same layer to simplify the manufacturing process of the array substrate, and the second extension portion 42 and the third extension portion 43 extend along the extension direction of the second signal line 41.

For example, as shown in FIG. 2A, FIG. 2C and FIG. 2D, the plurality of openings 21A are provided in each of the plurality of first signal lines 21 of the array substrate; the orthographic projection of the second extension portion 42 on the base substrate BS overlaps with the orthographic projection of the opening 21A on the base substrate BS. It should be noted that FIG. 2A only shows the manner in which the second extension portion 42 overlaps with the opening 21A. In some embodiments, the orthogonal projection of the third extension portion 43 on the base substrate BS overlaps with the orthogonal projection of the opening 21A on the base substrate BS, and the way in which the third extension portion 43 overlaps with the opening 21A is similar to the way in which the second extension portion 42 overlaps with the opening 21A.

For example, as shown in FIGS. 2A, 2C, and 2D, the third extension portion 43 is provided in the second conductive layer 40, that is, the third extension portion 43, the second extension portion 42, and the second signal line 41 are provided in the same layer (see the second conductive layer 40), so that the third extension portion 43, the second extension portion 42, and the second signal line 41 are formed by patterning the same film using the same mask plate, which can simplify the manufacturing process of the array substrate. In this case, for example, each of the second extension portion 42 and the third extension portion 43 extends along the extension direction of the second signal line 41 (i.e., the second direction) to simplify the wiring.

Figure 5A:
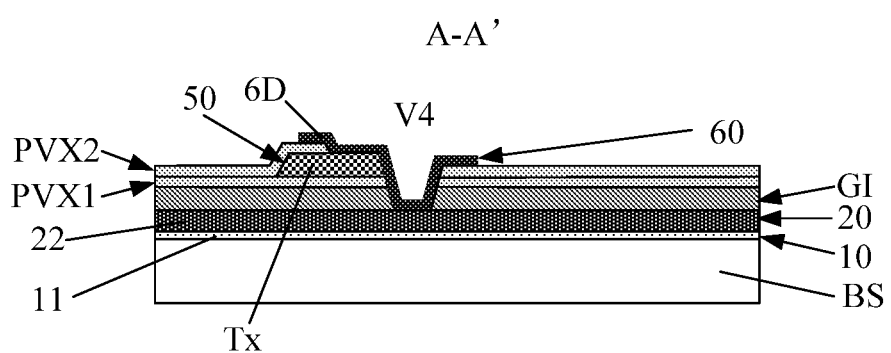
FIG. 5A is a schematic sectional view taken along the line A-A' in FIG. 4C.
Figure 5B:
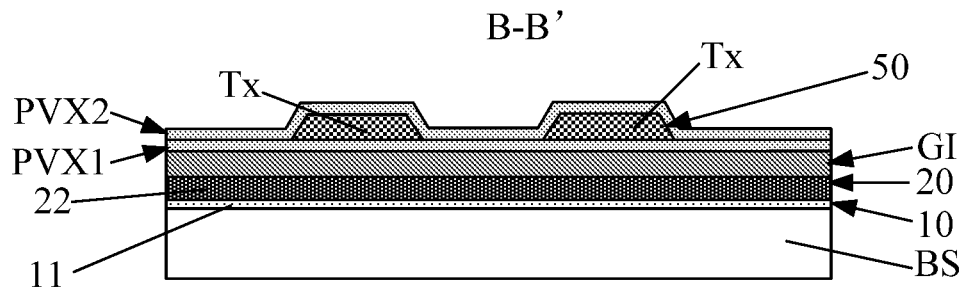
FIG. 5B is a schematic sectional view taken along the line B-B' in FIG. 4C.
Figure 5C:
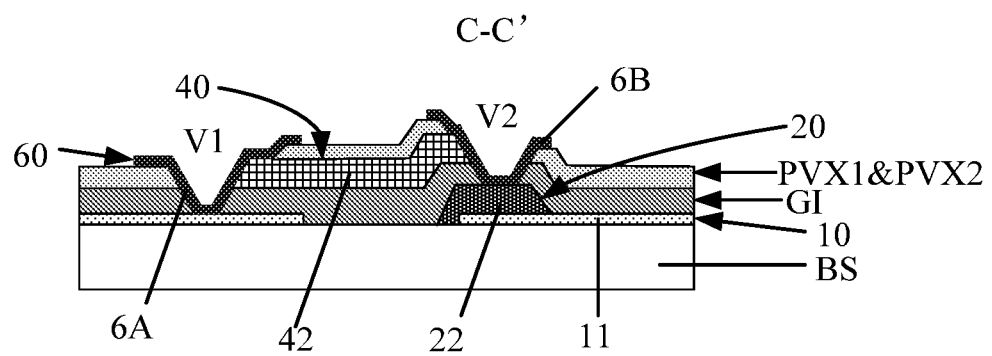
FIG. 5C is a schematic sectional view taken along the line C-C' in FIG. 4E.
Figure 5D:
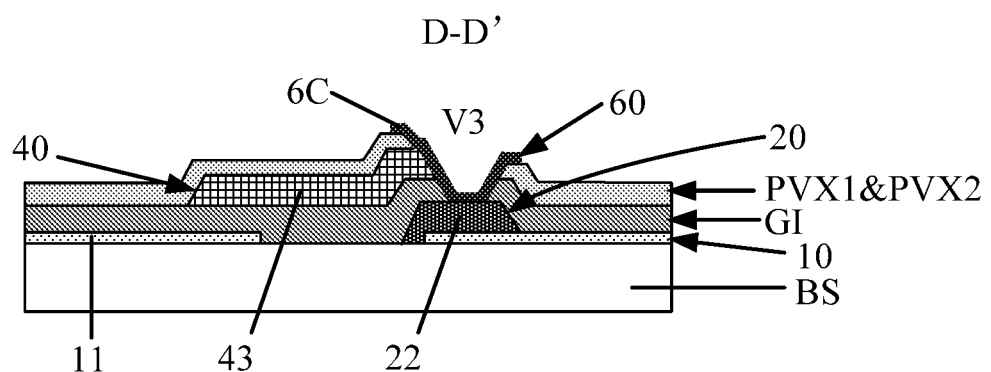
FIG. 5D is a schematic sectional view taken along the line D-D' in FIG. 4E.

FIG. 5A is a schematic sectional view taken along the line A-A' in FIG. 4C; FIG. 5B is a schematic sectional view taken along the line B-B' in FIG. 4C, and FIG. 5B does not show the second signal line 41 between the touch signal lines Tx adjacent to each other; FIG. 5C is a schematic sectional view taken along the line C-C' in FIG. 4E; FIG. 5D is a schematic sectional view taken along the line D-D' in FIG. 4E.

In FIGS. 5A to 5D, the common electrode layer 10, the first conductive layer 20, the gate insulating layer GI, the active layer AL, the second conductive layer 40, the first passivation insulating layer PVX1, the third conductive layer 50, the second passivation insulating layer PVX2 and the pixel electrode layer 60 are sequentially provided on the base substrate BS from bottom to top as an example. As shown in FIG. 5A, FIG. 5C and FIG. 5D, for example, the material of the pixel electrode layer 60 are used to realize electrical connection at the via holes V1-V4. For example, the pixel electrode layer 60 includes a first portion 6A, a second portion 6B, a third portion 6C and a fourth portion 6d. As shown in FIGS. 4E and 5C, the first portion 6A is provided in the first via hole V1 to electrically connect the second extension portion 42 with the touch electrode 11 in one touch electrode group TG; as shown in FIGS. 4E and 5C, the second portion 6B is provided in the second via hole V2 to electrically connect the second extension portion 42 with the touch electrode 11 in the other touch electrode group TG; as shown in FIG. 4E and FIG. 5D, the third portion 6C is provided in the third via hole V3 to electrically connect the third extension portion 43 with the first extension portion 22 in the touch sensing block TS, thereby electrically connecting the third extension portion 43 with the touch sensing block TS; as shown in FIG. 5A, the fourth portion 6D is provided in the fourth via hole V4 to electrically connect the touch signal line Tx with the corresponding first extension portion 22, thereby realizing the electrical connection between the touch sensing block TS and the corresponding touch signal line Tx. By using the material of the pixel electrode layer 60 to realize the electrical connection at the via holes V1-V4, it is possible to manufacture the gate insulating layer GI, the first passivation insulating layer PVX1 and the second passivation insulating layer PVX2 by using a same mask, so as to reduce the total number of the masks used in the process of manufacturing the array substrate.

For example, taking the array substrate shown in FIG. 2A as an example, the array substrate provided by at least one embodiment of the present disclosure can be manufactured by the following steps.

S11: as shown in FIG. 2B, forming a common electrode layer 10 on the base substrate BS by using a common electrode layer mask. As shown in FIGS. 2B and 4D, the common electrode layer 10 includes a plurality of rows of touch electrodes 11 spaced apart from each other (the row direction is along the first direction), and the plurality of rows of touch electrodes 11 extend along the first direction and are sequentially arranged along the second direction.

Step S12: as shown in FIG. 2B, forming a first conductive layer 20 on the base substrate BS by using a first conductive layer mask. As shown in FIGS. 2B and 4D, the first conductive layer 20 includes a plurality of first signal lines 21 extending along the first direction and a plurality of rows of first extension portions 22 extending along the first direction. Each row of first extension portions 22 includes a plurality of first extension portions 22 disconnected from each other, and each first extension portion 22 is electrically connected with some touch electrodes 11 of the same row of touch electrodes 11 to constitute the touch electrode group TG. The touch electrodes 11 and a row of first extension portions 22 corresponding to the touch electrodes 11 form a plurality of touch electrode groups TG arranged sequentially along the first direction; and in the second direction, a plurality of first signal lines 21 and a plurality of rows of first extension portions 22 are alternately provided and electrically insulated from each other.

S13: forming a gate insulating initial film used for forming a gate insulating layer GI on the base substrate BS to cover the common electrode layer 10 and the first conductive layer 20 (as shown in FIGS. 3A and 3B).

S14: forming a plurality of active layers AL (as shown in FIG. 2A) by using an active layer mask on the base substrate BS on which gate insulating initial film is formed.

Step S15: as shown in FIG. 2C, forming a second conductive layer 40 on the base substrate BS by using a second conductive layer mask. The second conductive layer 40 includes a plurality of source electrodes SE and a plurality of drain electrodes DE, and the source electrodes SE, the drain electrodes DE, the active layers AL, and a portion (which serves as gate electrodes) of the first signal lines 21 form a plurality of switching elements T. The second conductive layer 40 further includes a plurality of second signal lines 41 extending along the second direction and a plurality of columns of extension portions extending along the second direction. As shown in FIG. 4D, at least some of the plurality of columns of extension portions include a plurality of second extension portions 42 disconnected from each other and a plurality of third extension portions 43 disconnected from each other. One row of touch electrodes 11 is provided between the second extension portions adjacent to each other 42 in the second direction, each second extension portion 42 electrically connects the touch electrode groups TG adjacent to each other in the second direction. Multiple rows of touch electrodes 11 are provided between the third extension portions 43 adjacent to each other in the second direction, and each third extension portion 43 is electrically connected to only one touch electrode group TG of the touch electrode groups TG adjacent to each other. Thus, the plurality of rows of touch electrodes 11, the plurality of rows of first extension portions 22 and the plurality of columns of extension portions form a plurality of touch sensing blocks TS, each touch sensing block TS includes a plurality of touch electrode groups TG which are electrically connected with each other and arranged sequentially in the second direction S16: forming a first passivation insulating initial film used for forming a first passivation insulating layer PVX1 on the base substrate BS to cover the second conductive layer 40 (as shown in FIGS. 3A and 3B).

Step S17: forming a third conductive layer 50 on the base substrate BS on which the first passivation insulating initial film is formed by using a third conductive layer mask. As shown in FIG. 2D, the third conductive layer 50 includes a plurality of touch signal lines Tx.

S18: forming a second passivation insulating initial film to cover the third conductive layer 50 on the base substrate BS; and patterning the second passivation insulating initial film, the first passivation insulating initial film and the gate insulating initial film by using an insulating layer mask to form the gate insulating layer GI, the first passivation insulating layer PVX1, the second passivation insulating layer PVX2 and the via holes V1-V5. As shown in FIGS. 5C and 5D, the via holes V1, V2 and V3 penetrate through the gate insulating layer GI, the first passivation insulating layer PVX1 and the second passivation insulating layer PVX2. As shown in FIG. 5A, the via hole V4 penetrates the gate insulating layer GI, the first passivation insulating layer PVX1 and the second passivation insulating layer PVX2. In addition, the via hole V5 penetrates through the first passivation insulating layer PVX1 and the second passivation insulating layer PVX2 to expose a part of the drain electrode DE (as shown in FIGS. 2A and 2D).

Step S19: as shown in FIG. 2A, forming a pixel electrode layer 60 on the base substrate BS by using a pixel electrode layer mask. As shown in FIGS. 2A, 3A-3B and 5A-5D, the pixel electrode layer 60 includes a plurality of pixel electrodes 61, a plurality of first portions 6A, a plurality of second portions 6B, a plurality of third portions 6C and a plurality of fourth portions 6D. As shown in FIG. 2A, the pixel electrode 61 extends into the via hole V5 to electrically connect with the drain electrode DE. As shown in FIGS. 4E and 5C, the first portion 6A extends into the first via hole V1 to electrically connect the second extension portion 42 with the touch electrode 11 of one touch electrode group TG. As shown in FIG. 4E and FIG. 5C, the second portion 6B extends into the second via hole V2 to electrically connect the second extension portion 42 with the touch electrode 11 of the other touch electrode group TG. As shown in FIGS. 4E and 5D, the third portion 6C extends into the third via hole V3 to electrically connect the third extension portion 43 with the first extension portion 22 of the touch sensing block TS, thereby electrically connecting the third extension portion 43 with the touch sensing block TS. As shown in FIG. 5A, the fourth portion 6D extends into the fourth via hole V4 to electrically connect the touch signal line Tx with the corresponding first extension portion 22.

It should be noted that the embodiments of the present disclosure do not limit the sequence of the above steps. For example, in some embodiments, the step S11 may be performed after the step S12. For example, in other embodiments, the pixel electrode layer 60 may be formed first, and the common electrode layer 10 may be formed later.

In some embodiments of the present disclosure, for example, each of the common electrode layer 10 and the pixel electrode layer 60 is made of a transparent conductive metal oxide such as indium tin oxide or indium zinc oxide. For example, each of the first conductive layer 20, the second conductive layer 40 and the third conductive layer 50 is made of a metal material such as aluminum, aluminum alloy, copper, copper alloy, molybdenum or nickel. For example, each of the first conductive layer 20, the second conductive layer 40, and the third conductive layer 50 has a single-layer structure or a multi-layer structure. For example, each of the gate insulating layer GI, the first passivation insulating layer PVX1 and the second passivation insulating layer PVX2 is made of an inorganic insulating material, such as silicon dioxide, silicon nitride or silicon oxynitride.

Figure 6B:
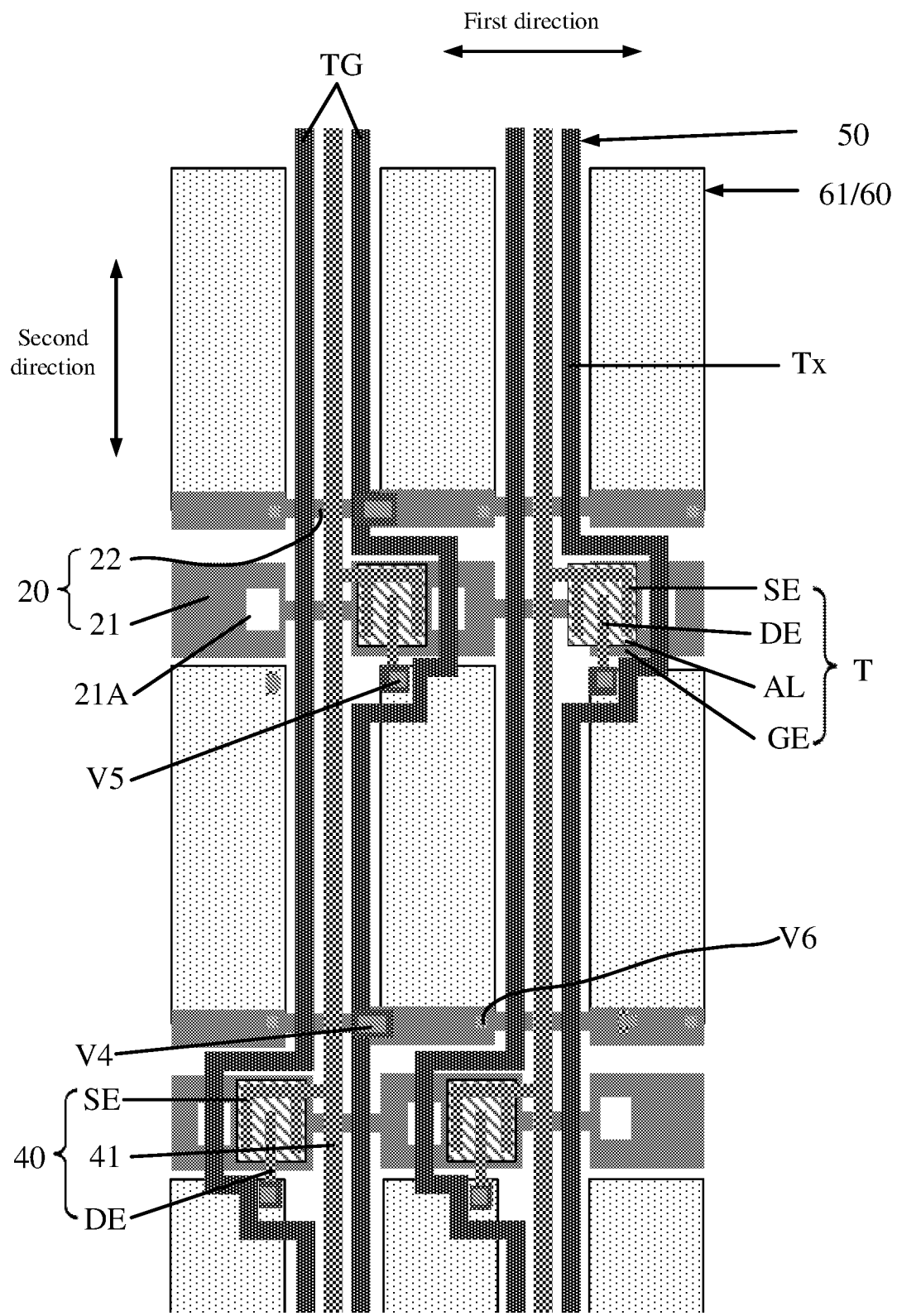
FIG. 6B is a schematic plan view of some structures in FIG. 6A.
Figure 7A:
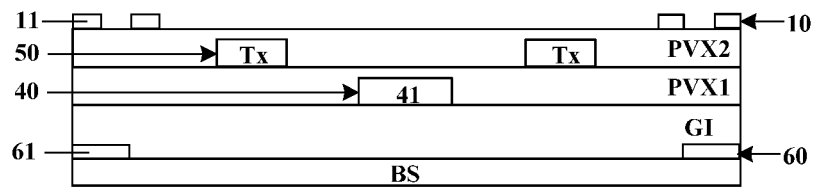
FIG. 7A is a simplified sectional schematic view taken along the line in FIG. 6A.
Figure 7B:
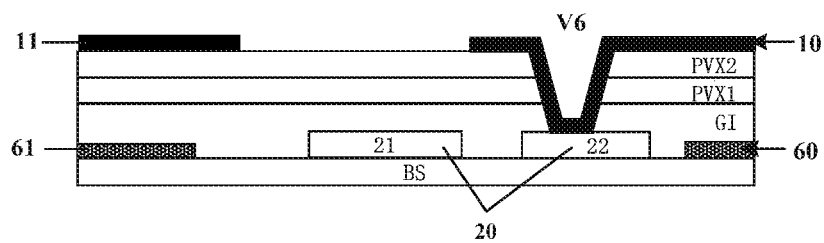
FIG. 7B is a simplified sectional schematic view taken along line IV-IV in FIG. 6A.

In the above embodiments, the touch electrode 11 is closer to the base substrate BS than the pixel electrode 61. Next, a structure in which the pixel electrode 61 is closer to the base substrate BS than the touch electrode 11 will be described with reference to FIGS. 6A to 7B. FIG. 6A is another schematic top view of the array substrate provided by at least one embodiment of the present disclosure; FIG. 6B is a schematic plan view of some structures in FIG. 6A; FIG. 7A is a simplified sectional schematic view taken along the line III-III in FIG. 6A; FIG. 7B is a simplified sectional schematic view taken along line IV-IV in FIG. 6A.

For example, as shown in FIGS. 6A to 7B, the array substrate provided by at least one embodiment of the present disclosure includes a common electrode layer 10 and a pixel electrode layer 60, and the pixel electrode layer 60 is provided between the base substrate and the common electrode layer 10 in the direction perpendicular to the base substrate. The common electrode layer 10 includes the touch electrodes 11, and the second extension portions 42 and the third extension portions 43 extending in the same direction. The first extension portions 22 and the touch electrodes 11, the second extension portions 42 and the third extension portions 43 included in the common electrode layer 10 are combined to form a plurality of touch sensing blocks TS. In the same touch sensing block TS (see TS-1), the touch electrodes 11 adjacent to each other in the second direction are electrically connected with each other by the second extension portion 42, the second extension portion 42 is directly connected to the touch electrodes 11 adjacent to each other in the second direction; the touch electrodes 11 adjacent to each other in the first direction are electrically connected with each other through the first extension portion 22 (for example, the touch electrode 11 extends into the via hole V6 to electrically connect the corresponding first extension portion 22, as shown in FIGS. 6A and 7B); and thus, the touch electrodes 11 in the same touch sensing block TS are connected with each other. The manner of disconnection between the touch sensing blocks TS adjacent to each other in the first direction is similar to the manner shown in FIG. 4D, that is, the disconnection between the touch sensing blocks TS adjacent to each other in the first direction is realized by disconnecting the first extension portions 22 of the adjacent touch sensing blocks TS from each other. The touch sensing blocks TS (see TS-1 and TS-2) adjacent to each other in the second direction are electrically insulated from each other by the third extension portion 43. For example, as shown in FIG. 6A, the third extension portion 43 is directly connected with the touch electrode 11 of the touch sensing block TS-2, protrudes from the touch electrode 11 of the touch sensing block TS-2 in the second direction and then passes over the first signal line 21, but does not extend to the touch electrode 11 of the touch sensing block TS-1

For example, the first extension portion 22 and the first signal line 21 are provided in the same layer, that is, they are provided in the first conductive layer 20, so as to simplify the manufacturing process of the array substrate.

For example, the third extension portion 43 overlaps with the opening 21A of the first signal line 21 to reduce the load of the array substrate.

For example, the array substrate shown in FIGS. 6A to 7B is manufactured by the following steps.

S21: forming a pixel electrode layer 60 on the base substrate BS by using a pixel electrode layer mask. The pixel electrode layer 60 includes a plurality of pixel electrodes 61.

S22: forming the first conductive layer 20 on the base substrate BS by using a first conductive layer mask. The first conductive layer 20 includes a plurality of first signal lines 21 and a plurality of rows of first extension portions 22, the plurality of first signal lines 21 and the plurality of rows of first extension portions 22 extend along the first direction and are arranged sequentially along the second direction different from the first direction. Each row of first extension portions 22 includes a plurality of first extension portions 22 disconnected from each other. The plurality of first signal lines 21 and the plurality of rows of first extension portions 22 are alternately provided and insulated from each other.

S23: forming a gate insulating initial film used for forming a gate insulating layer GI on the base substrate BS to cover the pixel electrode layer 60 and the first conductive layer 20.

S24: forming active layers AL on the base substrate BS by using an active layer mask.

S25: forming a second conductive layer 40 on the base substrate BS by using a second conductive layer mask. The second conductive layer 40 includes a plurality of second signal lines 41 extending along the second direction, source electrodes SE and drain electrodes DE. A portion (which serves as gate electrodes GE) of the first signal lines 21, the active layers AL, the source electrodes SE and drain electrodes DE are combined form the switching elements T.

S26: forming a first passivation insulating initial film used for forming a first passivation insulating layer PVX1 on the base substrate BS to cover the second conductive layer 40.

S27: forming a third conductive layer 50 on the base substrate BS by using a third conductive layer mask. The third conductive layer 50 includes a plurality of touch signal lines, and each touch signal line is electrically connected with the first extension portions 22 of the plurality of touch electrode groups included in the same touch sensing block.

S28: forming a second passivation insulating initial film used for forming a second passivation insulating layer PVX2 on the base substrate BS to cover the third conductive layer 50, and patterning the gate insulating initial film, the first passivation insulating initial film and the second passivation insulating initial film by using an insulating layer mask to form the gate insulating layer GI, the first passivation insulating layer PVX1, the second passivation insulating layer PVX2 and via holes V4-V6. The via holes V4 and V6 penetrate through the gate insulating layer GI, the first passivation insulating layer PVX1 and the second passivation insulating layer PVX2 to expose a part of the surface of the first extension portion 22, and the via hole V5 penetrates through the gate insulating layer GI, the first passivation insulating layer PVX1 and the second passivation insulating layer PVX2 to expose a part of the surface of the pixel electrode 61.

S29: forming a common electrode 10 on the base substrate BS by using a common electrode mask. The common electrode layer 10 includes the touch electrodes 11, the second extension portions 42 and the third extension portions 43. The touch electrode 11 extends into the via hole V6 to electrically connect the corresponding first extension portion 22, so as to realize the electrical connection between the touch electrodes 11 adjacent to each other 11 in the first direction. The second extension portion 42 electrically connects the touch electrodes 11 adjacent to each other in the second direction. The third extension portion 43 is electrically connected to only one touch electrode 11. In this way, the touch electrodes 11, the second extension portions 42 and the third extension portions 43 included in the common electrode layer 10 and the plurality of rows of first extension portions 22 included in the first conductive layer 20 are combined to form a plurality of touch sensing blocks TS.

The touch electrode 11 extends into the via hole V4 to electrically connect the touch signal line Tx with the first extension portion 22. In addition, a part of the material of the common electrode layer 10 is filled into the via hole V5 to electrically connect the drain electrode DE with the corresponding pixel electrode 61.

For example, in the embodiments shown in FIGS. 6A to 7B, the arrangement manner of the touch signal lines Tx, the first signal lines 21 and the second signal lines 41, the amount relationship and electrical connection relationship between the touch signal lines Tx and the touch sensing blocks TS, and the positional relationship between the touch electrodes 11 and the sub-pixel regions are respectively same as those shown in FIGS. 2A to 5D, which will not be repeated for simplicity.

At least one embodiment of the present disclosure further provides a touch display device, which comprises the array substrate provided by any one of the above embodiments.

Figure 8A:
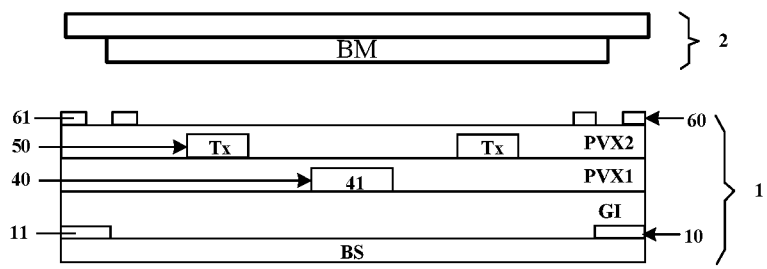
FIG. 8A is a simplified sectional schematic view taken along the line I-I in FIG. 2A in the case that the touch display device provided by at least one embodiment of the present disclosure is the in-cell touch display device.
Figure 8B:
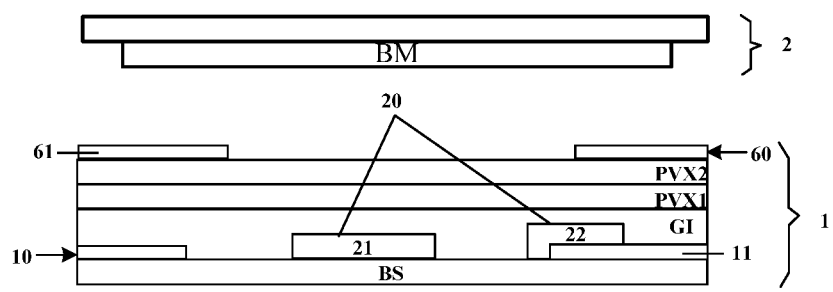
FIG. 8B is a simplified sectional schematic view taken along the line II-II in FIG. 2A in the case that the touch display device provided by at least one embodiment of the present disclosure is the in-cell touch display device.

For example, the touch display device provided by at least one embodiment of the present disclosure is an in-cell touch display device. FIG. 8A is a simplified sectional schematic view taken along the line I-I in FIG. 2A in the case that the touch display device provided by at least one embodiment of the present disclosure is the in-cell touch display device, and FIG. 8B is a simplified sectional schematic view taken along the line II-II in FIG. 2A in the case that the touch display device provided by at least one embodiment of the present disclosure is the in-cell touch display device. For example, as shown in FIGS. 8A and 8B, the in-cell touch display device includes an array substrate 1 and an opposite substrate 2 provided opposite to the array substrate 1; and the array substrate is the array substrate provided by any one of the above embodiments. The touch electrodes 11 of the array substrate 1 are provided on a side of the array substrate 1 facing the opposite substrate 2, and the opposite substrate 2 includes a base substrate BS2 and a black matrix BM. It can be seen from FIGS. 8A and 8B that the first signal lines 21, the second signal lines 41 and the touch signal lines Tx are all shielded by the black matrix BM, that is, the first signal lines 21, the second signal lines 41 and the touch signal lines Tx are all provided in the non-opening region of the sub-pixel region. In some embodiments, as shown in FIG. 8B, the first extension portions 22 are also shielded by the black matrix BM. For example, the in-cell touch display device is a liquid crystal display device; in this case, a liquid crystal layer is provided between the array substrate 1 and the opposite substrate 2, and the pixel electrodes 61 and the common electrodes (which are also served as the touch electrodes 11) included in the array substrate 1 are used to generate an electric field for controlling the deflection of liquid crystal molecules in the liquid crystal layer. In other embodiments, for example, the touch display device is not the in-cell touch display device.

As shown in FIGS. 8A and 8B, the touch electrodes 11 are closer to the base substrate BS than the pixel electrodes 61, so the touch display device is capable of realizing the double-sided touch mode. That is, in the front touch mode, a touch object (e.g., a user's finger) touches the side of the display device provided with the opposite substrate 2; in the back touch mode, the touch object touches the side of the display device provided with the array substrate 1. In other embodiments, the positions of the touch electrode 11 and the pixel electrode 61 may be interchanged.

For example, the touch display device is any product or component with touch and display functions, such as liquid crystal panel, electronic paper, OLED (Organic Light Emitting Diode) panel, mobile phone, tablet computer, television, display, notebook computer, digital photo frame, navigator, etc.

At least one embodiment of the present disclosure further provides a manufacturing method of the array substrate. Taking the array substrates shown in FIGS. 2A to 5D and the array substrates shown in FIGS. 6A to 7B as examples, the manufacturing method includes: forming a plurality of first signal lines 21 on the base substrate BS; forming a plurality of second signal lines 41 on the base substrate BS, so that the orthographic projections of the second signal lines 41 on the base substrate BS intersect with the orthographic projections of the first signal lines 21 on the base substrate BS; forming a plurality of touch sensing blocks TS provided on the base substrate BS and spaced apart from each other, so that each touch sensing block TS includes a plurality of touch electrodes 11 electrically connected with each other and spaced apart from each other; and forming a plurality of touch signal lines Tx on the base substrate BS, so that at least some of the touch signal lines Tx are electrically connected with the touch sensing blocks TS respectively. For example, as shown in FIG. 4A, the touch signal lines Tx are electrically connected to the touch sensing blocks TS in one-to-one correspondence manner; or, as shown in FIG. 4B, the first touch signal lines Tx1 are electrically connected with the touch sensing blocks TS in one-to-one correspondence manner, and the second touch signal lines Tx2 are electrically insulated from the touch sensing blocks TS. It should be noted that the electrical connection between the touch signal lines Tx and the touch sensing blocks TS is not limited to the manners shown in FIGS. 4A and 4B.

In the manufacturing method provided by at least one embodiment of the present disclosure, the plurality of touch signal lines Tx extend along the extension direction of the plurality of second signal lines 41, the plurality of touch signal lines Tx are grouped into a plurality of touch signal line groups TG, each touch signal line group TG includes the touch signal lines Tx adjacent to each other, the orthographic projections of the touch signal lines Tx adjacent to each other included in the same touch signal line group TG are provided on two sides of the orthographic projection of the same second signal line 41 on the base substrate BS. Each of the orthographic projections of the touch signal lines Tx adjacent to each other and the orthographic projection of the same second signal line 41 includes a portion provided between the orthographic projections of the touch electrodes adjacent to each other 11 on the base substrate BS, and the layer 50 in which the touch signal lines Tx adjacent to each other are provided is different from the layer 40 in which the same second signal line 41 is provided. Because each of the touch signal line Tx and the second signal line 41 includes a portion that does not overlap with the touch electrode 11, the load of the array substrate can be reduced. Because the second signal line 41 is provided between the two touch signal lines Tx adjacent to each other included in the same touch signal line group TG, the uniformity of the electric fields on two sides of the second signal line 41 is improved. Because the touch signal line Tx and the second signal line 41 are provided in different layers, it is beneficial to improve the aperture ratio and facilitate the repairing of the signal line.

Other structures of the array substrate obtained by the manufacturing method provided by at least one embodiment of the present disclosure may refer to the related description of the array substrate in the above embodiments. For the manufacturing method of the array substrate shown in FIGS. 2A to 5D, refer to the above steps S11 to S19; and for the manufacturing method of the array substrate shown in FIGS. 6A to 7B, refer to the above steps S21 to S29.

Embodiments of the present disclosure and features in embodiments can be combined with each other without conflict.

The above is only an exemplary embodiment of the present disclosure, and is not intended to limit the protection scope of the present disclosure, which is determined by the appended claims.

The foregoing embodiments merely are exemplary embodiments of the disclosure, and not intended to define the scope of the disclosure, and the scope of the disclosure is determined by the appended claims.

What is claimed is:

1. An array substrate, comprising:
a base substrate;
a plurality of first signal lines provided on the base substrate;
a plurality of second signal lines provided on the base substrate, wherein orthographic projections of the plurality of second signal lines on the base substrate intersect with orthographic projections of the plurality of first signal lines on the base substrate;
a plurality of touch sensing blocks provided on the base substrate and spaced apart from each other, wherein each of the plurality of touch sensing blocks comprises a plurality of touch electrodes electrically connected with each other and spaced apart from each other; and
a plurality of touch signal lines provided on the base substrate, wherein at least some of the plurality of touch signal lines are electrically connected with the plurality of touch sensing blocks respectively, wherein
the plurality of touch signal lines extend along an extension direction of the plurality of second signal lines, the plurality of touch signal lines are grouped into a plurality of touch signal line groups, each touch signal line group comprises the touch signal lines adjacent to each other, orthographic projections of the touch signal lines adjacent to each other comprised in a same touch signal line group on the base substrate are respectively provided on two sides of an orthographic projection of a same second signal line on the base substrate, each of the orthographic projections of the touch signal lines adjacent to each other and the orthographic projection of the same second signal line comprises a portion provided between orthographic projections of the touch electrodes adjacent to each other on the base substrate, and a layer in which the touch signal lines adjacent to each other are provided is different from a layer in which the same second signal line is provided;
each of the plurality of touch signal lines comprises a plurality of main portions and a plurality of bent portions, and the plurality of main portions and the plurality of bent portions are alternately provided;
an orthographic projection of each of the plurality of main portions on the base substrate is provided in a region between the orthographic projections of the touch electrodes adjacent to each other on the base substrate.

2. The array substrate according to claim 1, further comprising a plurality of switching elements provided on the base substrate, wherein each of the plurality of switching elements is provided between one of the plurality of bent portions and the same second signal line.

3. The array substrate according to claim 1, wherein the plurality of first signal lines are provided with a plurality of openings; and orthographic projections of at least some of the plurality of openings on the base substrate overlap with orthographic projections of the plurality of bent portions on the base substrate respectively.

4. The array substrate according to claim 1, wherein each of the plurality of touch sensing blocks comprises a plurality of touch electrode groups arranged sequentially, and each of the plurality of touch electrode groups comprises multiple touch electrodes spaced apart from each other and a first extension portion electrically connected with the multiple touch electrodes; and each of the plurality of touch sensing blocks further comprises a plurality of second extension portions, and each of the plurality of second extension portions is provided between and electrically connected with the touch electrode groups adjacent to each other.

5. The array substrate according to claim 4, wherein one of the plurality of first signal lines and a third extension portion are provided between the touch sensing blocks adjacent to each other in the extension direction of the plurality of second signal lines, the third extension is electrically connected with one of the touch sensing blocks adjacent to each other and insulated from the other of the touch sensing blocks adjacent to each other, and an orthographic projection of the third extension on the base substrate intersects with an orthographic projection of the one of the plurality of first signal line provided between the touch sensing blocks adjacent to each other on the base substrate.

6. The array substrate according to claim 5, wherein the plurality of second extension portions and the third extension portion are provided in a same layer, and the plurality of second extension portions and the third extension portion extend along the extension direction of the plurality of second signal lines.

7. The array substrate according to claim 5, wherein the plurality of first signal lines are provided with a plurality of openings, and orthographic projections of the plurality of second extension portion and the third extension portion on the base substrate respectively overlap with orthographic projections of at least some of the plurality of openings on the base substrate.

8. The array substrate according to claim 5, wherein the array substrate comprises a common electrode layer and a pixel electrode layer, the common electrode layer is provided between the base substrate and the pixel electrode layer in a direction perpendicular to the base substrate, and the common electrode layer comprises the plurality of touch electrodes in the plurality of touch sensing blocks;

the pixel electrode layer comprises a first portion, a second portion and a third portion, wherein one of the plurality of second extension portions is electrically connected with the touch electrode groups adjacent to each other by the first portion and the second portion, and the third extension portion is electrically connected with the one of the touch sensing blocks adjacent to each other by the third portion.

9. The array substrate according to claim 8, wherein the pixel electrode layer further comprises a fourth portion, and the first extension portion is electrically connected with one of the plurality of touch signal lines by the fourth portion so as to electrically connect the touch sensing block including the first extension portion to the one of the plurality of touch signal lines.

10. The array substrate according to claim 8, wherein the plurality of second extension portions, the third extension and the plurality of second signal lines are provided in a same layer.

11. The array substrate according to claim 8, wherein
the array substrate comprises the common electrode layer, a first conductive layer, a second conductive layer, a third conductive layer and the pixel electrode layer which are provided on the base substrate;
the common electrode layer comprises a plurality of rows of touch electrodes, the plurality of rows of touch electrodes extend along a first direction and are sequentially arranged along a second direction, and the second direction is different from the first direction;
the first conductive layer comprises the plurality of first signal lines extending along the first direction and a plurality of rows of first extension portions extending along the first direction, each row of first extension portions comprises a plurality of first extension portions disconnected from each other, and each first extension portion is electrically connected with some touch electrodes of a same row of touch electrodes to constitute the touch electrode group, the plurality of first signal lines and the plurality of rows of first extension portions are alternately provided and insulated from each other;
the second conductive layer comprises the plurality of second signal lines extending along the second direction and a plurality of columns of extension portions extending along the second direction, at least some of the plurality of columns of extension portions comprise a plurality of second extension portions disconnected from each other and a plurality of third extension portions disconnected from each other, one row of the plurality of rows of touch electrodes is provided between the second extension portions adjacent to each other in the second direction, each second extension portion is electrically connected with the touch electrode groups adjacent to each other in the second direction, multiple rows of the plurality of rows of touch electrodes are provided between the third extension portions adjacent to each other in the second direction, and each third extension portion is electrically connected with one touch electrode group, so that the plurality of rows of touch electrodes, the plurality of rows of first extension portions and the plurality of columns of extension portions are combined into the plurality of touch sensing blocks, and each touch sensing block comprises the plurality of touch electrode groups which are electrically connected with each other and sequentially arranged in the second direction;
the third conductive layer comprises the plurality of touch signal lines;
the pixel electrode layer comprises a plurality of pixel electrodes, and an orthographic projection of one of the plurality of touch signal lines on the base substrate comprises a portion provided between orthographic projections of the second signal line and the pixel electrode which are adjacent to the one of the plurality of touch signal lines on the base substrate.

12. The array substrate according to claim 5, wherein
the array substrate comprises a common electrode layer and a pixel electrode layer, the pixel electrode layer is provided between the base substrate and the common electrode layer in a direction perpendicular to the base substrate;
the common electrode layer comprises the plurality of touch electrodes in the plurality of touch sensing blocks, the plurality of second extension portions and the third extension portion.

13. The array substrate according to claim 12, wherein
the array substrate comprises the pixel electrode layer, a first conductive layer, a second conductive layer, a third conductive layer and the common electrode layer which are provided on the base substrate;
the pixel electrode layer comprises a plurality of pixel electrodes;
the first conductive layer comprises the plurality of first signal lines and a plurality of rows of first extension portions, the plurality of first signal lines and the plurality of rows of first extension portions extend along a first direction and are sequentially arranged along a second direction different from the first direction, each row of first extension portions comprises a plurality of first extension portions which are disconnected from each other, and the plurality of first signal lines and the plurality of rows of first extension portions are alternately provided and insulated from each other;
the second conductive layer comprises the plurality of second signal lines extending along the second direction;
the third conductive layer comprises the plurality of touch signal lines, and one of the plurality of touch signal lines is electrically connected with the first extension portions of the plurality of touch electrode groups comprised in the same touch sensing block;
the common electrode layer comprises the touch electrodes, the second extension portions and the third extension portion, and the touch electrodes, the second extension portions and the third extension portion comprised in the common electrode layer and the plurality of rows of first extension portions comprised in the first conductive layer are combined into the plurality of touch sensing blocks.

14. The array substrate according to claim 1, wherein the array substrate comprises a common electrode layer and a pixel electrode layer sequentially provided on the base substrate, and the common electrode layer comprises the plurality of touch electrodes.

15. The array substrate according to claim 1, wherein the array substrate comprises a plurality of sub-pixel regions, each of the plurality of sub-pixel regions is provided with one touch electrode of the plurality of touch sensing blocks, and each touch electrode is provided in one of the plurality of sub-pixel regions.

16. The array substrate according to claim 1, wherein
a total number of the plurality of touch signal lines is greater than a total number of the plurality of touch sensing blocks;
the plurality of touch signal lines comprise a plurality of first touch signal lines and a plurality of second touch signal lines, the plurality of first touch signal lines are electrically connected with the plurality of touch sensing blocks respectively, and the plurality of second touch signal lines are insulated from the plurality of touch sensing blocks.

17. A touch display device, comprising the array substrate according to claim 1.

18. A manufacturing method of an array substrate, comprising:
forming a plurality of first signal lines on a base substrate;

forming a plurality of second signal lines on the base substrate, wherein orthographic projections of the plurality of second signal lines on the base substrate intersect with orthographic projections of the plurality of first signal lines on the base substrate;
forming a plurality of touch sensing blocks spaced apart from each other on the base substrate, wherein each of the plurality of touch sensing blocks comprises a plurality of touch electrodes electrically connected with each other and spaced apart from each other; and
forming a plurality of touch signal lines on the base substrate, wherein at least some of the plurality of touch signal lines are electrically connected with the plurality of touch sensing blocks respectively, wherein
the plurality of touch signal lines extend along an extension direction of the plurality of second signal lines, the plurality of touch signal lines are grouped into a plurality of touch signal line groups, each touch signal line group comprises the touch signal lines adjacent to each other, orthographic projections of the touch signal lines adjacent to each other comprised in a same touch signal line group on the base substrate are respectively provided on two sides of an orthographic projection of a same second signal line on the base substrate, each of the orthographic projections of the touch signal lines adjacent to each other and the orthographic projection of the same second signal line comprises a portion provided between orthographic projections of the touch electrodes adjacent to each other on the base substrate, and a layer in which the touch signal lines adjacent to each other are provided is different from a layer in which the same second signal line is provided;
each of the plurality of touch signal lines comprises a plurality of main portions and a plurality of bent portions, and the plurality of main portions and the plurality of bent portions are alternately provided;
an orthographic projection of each of the plurality of main portions on the base substrate is provided in a region between the orthographic projections of the touch electrodes adjacent to each other on the base substrate.

* * * * *